(12) United States Patent
Kajimoto et al.

(10) Patent No.: US 12,336,382 B2
(45) Date of Patent: Jun. 17, 2025

(54) ORGANIC DEVICE, DISPLAY APPARATUS, IMAGE CAPTURING APPARATUS, ILLUMINATION APPARATUS, AND MOVING BODY

(71) Applicant: CANON KABUSHIKI KAISHA, Tokyo (JP)

(72) Inventors: Norifumi Kajimoto, Zama (JP); Takayuki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 404 days.

(21) Appl. No.: 17/812,804

(22) Filed: Jul. 15, 2022

(65) Prior Publication Data
US 2022/0359849 A1 Nov. 10, 2022

Related U.S. Application Data

(62) Division of application No. 16/857,494, filed on Apr. 24, 2020, now Pat. No. 11,430,970.

(30) Foreign Application Priority Data

May 7, 2019 (JP) .................. 2019-087724

(51) Int. Cl.
*H01L 51/52* (2006.01)
*F21K 9/68* (2016.01)
(Continued)

(52) U.S. Cl.
CPC ............ *H10K 50/852* (2023.02); *F21K 9/68* (2016.08); *H10F 39/8067* (2025.01);
(Continued)

(58) Field of Classification Search
CPC .. H10K 50/852; H10K 50/818; H10K 59/351; H10K 59/38; H10K 2102/351; F21K 9/68; H01L 27/14629; Y02B 20/00
See application file for complete search history.

(56) References Cited

U.S. PATENT DOCUMENTS 8,471,463 B2    6/2013  Sumida et al.
8,563,971 B2   10/2013  Nakamura et al.
(Continued)

FOREIGN PATENT DOCUMENTS

EP    2 172 991 A1    4/2010
JP    2003-29032 A1   1/2003
(Continued)

OTHER PUBLICATIONS

Notice of Reasons for Refusal in Japanese Application No. 2023-105335 (Feb. 2024).

*Primary Examiner* — Elmito Breval
(74) *Attorney, Agent, or Firm* — Venable LLP

(57) ABSTRACT

An organic device comprising a reflective electrode, an organic layer arranged on the reflective electrode, a semi-transmissive electrode arranged on the organic layer and a reflection surface formed above the semi-transmissive electrode is provided. The organic layer emits white light and includes a blue-emitting layer. An optical distance L of the organic layer satisfies $L \geq [\{(\phi r + \phi s)/\pi\} \times (\lambda b/4)] \times 1.2$, where $\lambda b$ is a peak wavelength of the blue-emitting layer, $\phi r$ and $\phi s$ are a phase shift of the wavelength $\lambda b$ in the reflective electrode and the semi-transmissive electrode, respectively. A resonant wavelength of an optical distance between the semi-transmissive electrode and the reflection surface is shorter than the wavelength $\lambda b$.

18 Claims, 18 Drawing Sheets

(51) Int. Cl.
  *H10F 39/00* (2025.01)
  *H10K 50/818* (2023.01)
  *H10K 50/852* (2023.01)
  *H10K 59/35* (2023.01)
  *H10K 59/38* (2023.01)
  *H10K 102/00* (2023.01)

(52) U.S. Cl.
  CPC ......... *H10K 50/818* (2023.02); *H10K 59/351* (2023.02); *H10K 59/38* (2023.02); *H10K 2102/351* (2023.02)

(56) References Cited

U.S. PATENT DOCUMENTS

| | | |
|---|---|---|
| 8,779,656 B2 | 7/2014 | Kajimoto |
| 8,895,969 B2 | 11/2014 | Kim et al. |
| 10,637,004 B2 | 4/2020 | Kajimoto |
| 10,872,939 B2 | 12/2020 | Polyakov et al. |
| 10,985,323 B2 | 4/2021 | Kajimoto et al. |
| 11,031,577 B1 | 6/2021 | Hamer et al. |
| 2004/0037206 A1 | 2/2004 | Shinoda |
| 2005/0041710 A1 | 2/2005 | Makita et al. |
| 2005/0190454 A1 | 9/2005 | Shinoda |
| 2006/0113907 A1 | 6/2006 | Im et al. |
| 2008/0180026 A1 | 7/2008 | Kondo et al. |
| 2009/0315921 A1* | 12/2009 | Sakaigawa ........... G09G 3/3413 345/694 |
| 2011/0095675 A1 | 4/2011 | Oda |
| 2018/0090715 A1 | 3/2018 | Yasukawa |
| 2019/0123279 A1 | 4/2019 | Kajimoto et al. |

FOREIGN PATENT DOCUMENTS

| | | |
|---|---|---|
| JP | 2003-161801 A1 | 6/2003 |
| JP | 2005-64328 A1 | 3/2005 |
| JP | 2006-156390 A1 | 6/2006 |
| JP | 2007-234253 A1 | 9/2007 |
| JP | 2008-204948 A1 | 9/2008 |
| JP | 2011-90923 A1 | 5/2011 |
| JP | 2011-210677 A | 10/2011 |
| JP | 2013-51155 A1 | 3/2013 |
| JP | 2017-195131 A1 | 10/2017 |
| JP | 2018-056364 A1 | 4/2018 |

\* cited by examiner

FIG. 18

| MULTI-OBJECTIVE OPTIMIZATION VARIABLES | | |
|---|---|---|
| | LOWER LIMIT | UPPER LIMIT |
| SECOND LAYER (SECOND EMBODIMENT) [nm] | 8 | 17 |
| FIRST LAYER (SECOND EMBODIMENT) [nm] | 10 | 250 |
| SECOND LAYER (FIRST EMBODIMENT) [nm] | 10 | 300 |
| FIRST LAYER (FIRST EMBODIMENT) [nm] | 10 | 250 |
| SEMI-TRANSMISSIVE ELECTRODE [nm] | 10 | 16 |
| ELECTRON INJECTION TRANSPORT LAYER [nm] | 15 | 135 |
| HOLE INJECTION TRANSPORT LAYER [nm] | 13.4 | 28.4 |
| EXCITON GENERATION RATIO OF BD $\gamma_b$ | 0.35 | 0.55 |
| EXCITON GENERATION RATIO GD $\gamma_g$ | 0.17 | 0.43 |

FIG. 19

| | | FIRST LAYER | SECOND LAYER | THIRD LAYER |
|---|---|---|---|---|
| D100 | COMPARATIVE EXAMPLE | — | — | 1.98 |
| D101 | COMPARATIVE EXAMPLE | 1.4 | — | 1.98 |
| D102 | COMPARATIVE EXAMPLE | 2.3 | — | 1.98 |
| D110 | EXAMPLE | 1.99 | 1.4 | 1.98 |
| D111 | EXAMPLE | 2.3 | 1.4 | 1.98 |

FIG. 20

| | | FIRST LAYER | SECOND LAYER | THIRD LAYER |
|---|---|---|---|---|
| D112 | EXAMPLE | 2.4 | 1.4 | 1.98 |
| D113 | EXAMPLE | 2.2 | 1.4 | 1.98 |
| D114 | EXAMPLE | 2.2 | 1.6 | 1.98 |

FIG. 21

| | | COEFFICIENT A OF ORGANIC LAYER | COEFFICIENT B OF FIRST LAYER | COEFFICIENT B OF SECOND LAYER | CHROMATICITY OF B PIXEL (u', v') |
|---|---|---|---|---|---|
| D100-a | COMPARATIVE EXAMPLE | 1.26 | – | – | (0.152, 0.205) |
| D114-a | COMPARATIVE EXAMPLE | 1.26 | 1.00 | 1.00 | (0.150, 0.188) |
| D114-b | EXAMPLE | 1.26 | 0.64 | 1.00 | (0.150, 0.160) |

FIG. 22

| | | COEFFICIENT A OF ORGANIC LAYER | COEFFICIENT C OF FIRST LAYER | CHROMATICITY OF B PIXEL (u', v') |
|---|---|---|---|---|
| D100-b | COMPARATIVE EXAMPLE | 1.31 | – | (0.140, 0.215) |
| D202-a | EXAMPLE | 1.31 | 0.67 | (0.163, 0.162) |

ORGANIC DEVICE, DISPLAY APPARATUS, IMAGE CAPTURING APPARATUS, ILLUMINATION APPARATUS, AND MOVING BODY

CROSS REFERENCE TO RELATED APPLICATIONS

This application is a divisional application of U.S. patent application Ser. No. 16/857,494, filed Apr. 24, 2020, which claims the benefit of Japanese Patent Application No. 2019-087724, filed May 7, 2019. Both of these prior applications are hereby incorporated by reference herein in their entirety.

BACKGROUND OF THE INVENTION

Field of the Invention

The present invention relates to an organic device, a display apparatus, an image capturing apparatus, an illumination apparatus, and a moving body.

Description of the Related Art

An organic device that includes an organic EL light emitting element has gained attention. There is known a method (to be referred to as a white+CF method hereinafter) that uses a light emitting element which emits white light and a color filter to increase the resolution of an organic device. Since an organic layer is deposited on the entire surface of a substrate in the white+CF method, the resolution can be increased easily by adjusting the pixel size, the pitch between the pixels, or the like compared to a method in which the organic layer is deposited for each color by using a metal mask.

In Japanese Patent Laid-Open No. 2011-210677, there is disclosed that a plurality of optical path adjustment layers for adjusting light interference will be arranged on a semi-transmissive electrode on a light-extraction side to make, with respect to a wavelength $\lambda$ of a light beam to be extracted, the optical distance between a light emitting layer and an optical path adjustment layer be an integer multiple of $\lambda/4$.

Since it is difficult to optimize the light extraction structure for each color in the white+CF method, the light extraction efficiency may decrease. Hence, the film thickness of an organic layer which includes the light emitting layer is decreased to reduce a driving voltage so that high-luminance display can be performed, as a result, by the same voltage. When the film thickness of organic layer is to be decreased, the film thickness of the organic layer can be designed to have a film thickness that can cause interference (resonance) for strengthening light to occur by using optical interference, and be designed to have a minimum order of interference for film thickness reduction. Since the chromaticity of a blue pixel strongly depends on the film thickness of the organic layer, the film thickness of the organic layer for displaying deep blue needs to be 75 nm or less in a case in which the minimum order of interference is to be used. However, if the film thickness of the organic layer is decreased to be about 100 nm or less, leakages and short circuits due to unevenness caused by a foreign object or the like may increase exponentially, and the yield will decrease in some cases.

If the film thickness of the organic layer is increased to improve the yield, the optical path adjustment layer disclosed in Japanese Patent Laid-Open No. 2011-210677 cannot modulate the shift in the interference condition caused by the increase in the film thickness of the organic layer. Thus, it may reduce the chromaticity. That is, it is difficult to improve both the yield and the color reproducibility by using the structure disclosed in Japanese Patent Laid-Open No. 2011-210677.

SUMMARY OF THE INVENTION

Some of the embodiments of the present invention will provide a technique advantageous in implementing both an improvement in reliability and an improvement in color reproducibility of an organic device.

According to some embodiments, an organic device comprising a reflective electrode configured to reflect light, an organic layer arranged on the reflective electrode, a semi-transmissive electrode arranged on the organic layer, and a reflection surface formed above the semi-transmissive electrode, wherein the organic layer emits white light and includes a light emitting layer configured to emit blue light, an optical distance L of the organic layer satisfies $L \geq [\{(\phi r + \phi s)/\pi\}(\lambda b/4)] \times 1.2$ where $\lambda b$ [nm] is a peak wavelength of emitted light of a blue light emitting layer, $\phi r$ [rad] is a phase shift amount of the light of the wavelength $\lambda b$ in the reflective electrode, $\phi s$ [rad] is a phase shift amount of the light of the wavelength $\lambda b$ in the semi-transmissive electrode, and a resonant wavelength of an optical distance between the semi-transmissive electrode and the reflection surface is shorter than the wavelength $\lambda b$, is provided.

According to some other embodiments, an organic device comprising a reflective electrode configured to reflect light, an organic layer arranged on the reflective electrode, a semi-transmissive electrode arranged on the organic layer, and an interference adjustment layer arranged on the semi-transmissive electrode, wherein the organic layer emits white light and includes a light emitting layer configured to emit blue light, the interference adjustment layer includes a first layer in contact with the semi-transmissive electrode, a second layer arranged on the first layer, and a third layer arranged on the second layer, the first layer is made of an element selected from the group consisting of silicon nitride, silicon oxynitride, titanium oxide, zinc sulfide, and indium tin oxide, the second layer is made of an element selected from the group consisting of magnesium fluoride, lithium fluoride, a fluoropolymer, silver, magnesium, and combinations thereof, the third layer is made of an element selected from the group consisting of silicon oxide, silicon nitride, silicon oxynitride, and aluminum oxide, a film thickness of the organic layer is not less than 85 nm, a film thickness of the first layer is not more than 50 nm, and a film thickness of the second layer is not less than 10 nm and not more than 300 nm, is provided.

According to still other embodiments, an organic device comprising a reflective electrode, an organic layer arranged on the reflective electrode, a semi-transmissive electrode arranged on the organic layer, and a reflection surface formed above the semi-transmissive electrode, wherein the organic layer emits white light and includes a light emitting layer configured to emit blue light, a resonant wavelength of the organic layer is not less than 510 nm and not more than 550 nm, a resonant wavelength of an optical distance between the organic layer and the reflection surface is not more than 435 nm, and a minimum value of optical interference of the optical distance between the organic layer and the reflection surface is not less than 480 nm and not more than 510 nm, is provided.

Further features of the present invention will become apparent from the following description of exemplary embodiments (with reference to the attached drawings).

BRIEF DESCRIPTION OF THE DRAWINGS

FIG. 18 is a table showing film thicknesses of respective components and exciton generation ratios of the organic device according to FIG. 1;

FIG. 19 is a table showing refractive index of the interference layer of each organic device according to FIG. 1 and that of each organic device according to the comparative example;

FIG. 20 is a table showing the refractive index of the interference layer of each organic device according to FIG. 1;

FIG. 21 is a table showing the relationship between the coefficient A of the organic layer, the coefficient B of the first layer, the coefficient B of a second layer, and the chromaticity v' of the B pixel of the organic device according to FIG. 1 and that of each organic device according to the comparative example;

FIG. 22 is a table showing the relationship between the coefficient A of the organic layer, the coefficient C of the first layer, and the chromaticity v' of the B pixel of the organic device according to FIG. 1 and that of the organic device according to the comparative example;

DESCRIPTION OF THE EMBODIMENTS

Figure 1:
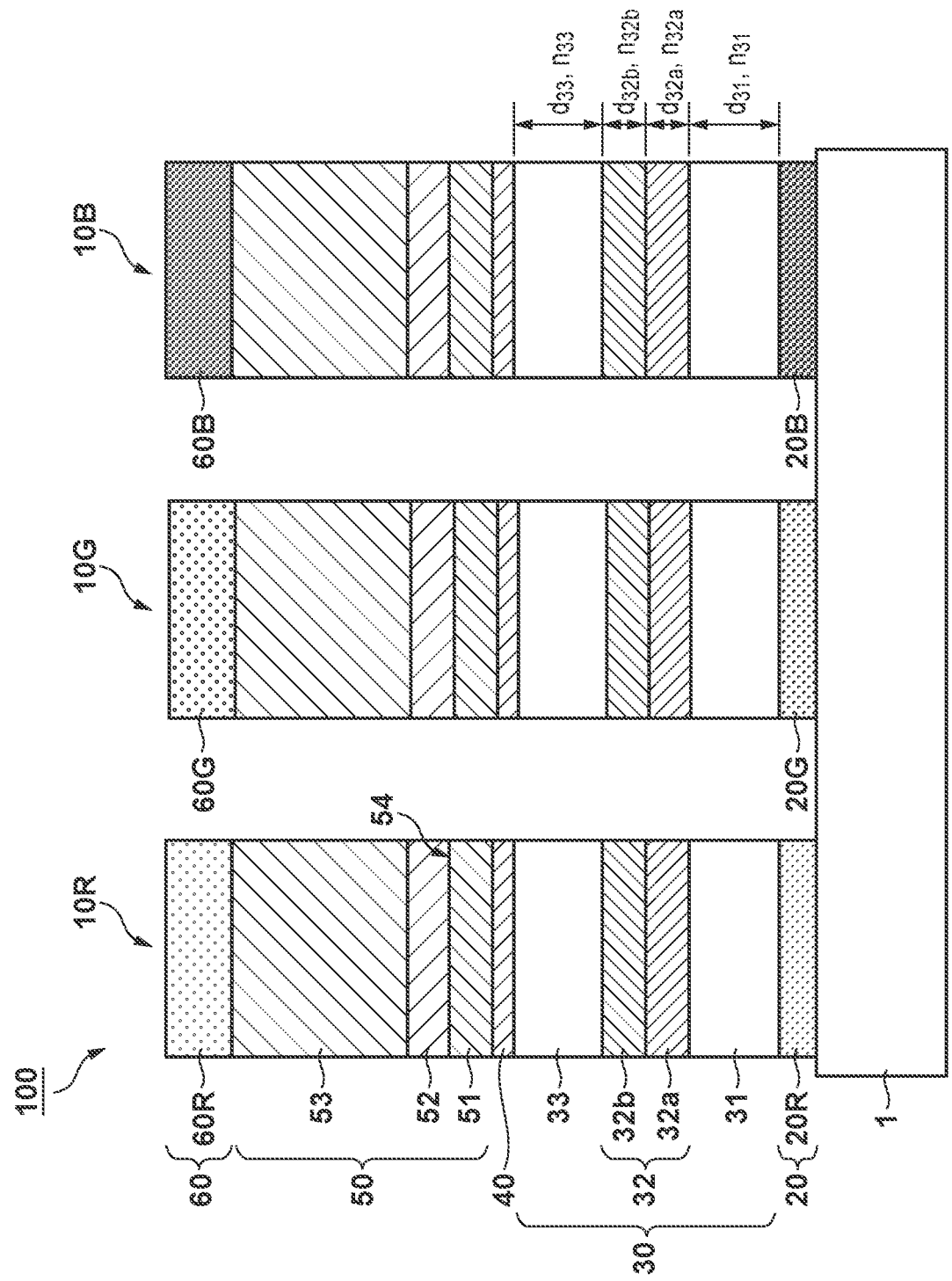
FIG. 1 is a sectional view schematically showing an example of the arrangement of an organic device according to this embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 2:
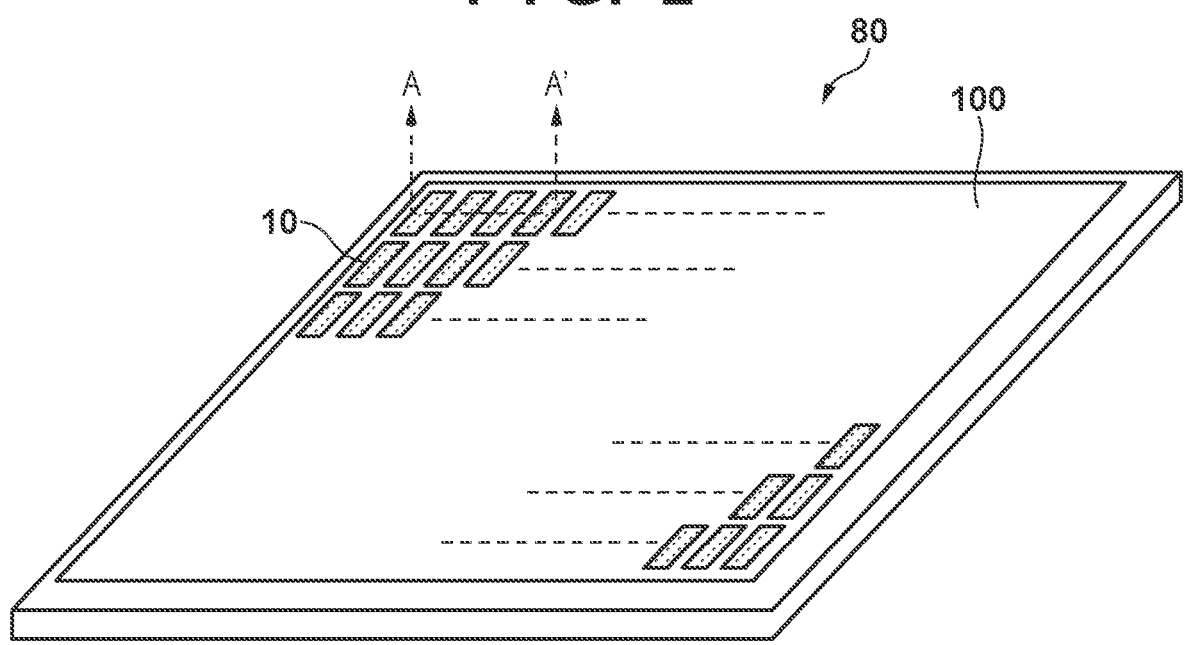
FIG. 2 is a perspective view of a display apparatus using the organic device according to FIG. 1.

The structure of an organic device according to embodiments of the present invention will be described below with reference to FIGS. 1 to 22. FIG. 1 is a sectional view showing the structure of an organic device 100 according to this embodiment. FIG. 2 is a perspective view schematically showing the arrangement of one embodiment of a display apparatus 80 using the organic device 100. The organic device 100 includes a plurality of light emitting elements 10. A section taken along a line A-A' shown in FIG. 2 is the sectional view shown in FIG. 1, and a single pixel for color display is formed by three light emitting elements 10 of the display apparatus 80. When specifying each light emitting element 10, a suffix will be added following the reference number as in the manner of the light emitting element 10"R". This denotation will be performed in the same manner for other components as well. Although the light emitting elements 10 are in a stripe arrangement in the examples shown in FIGS. 1 and 2, a delta arrangement or a square arrangement may be used.

Each of the plurality of light emitting elements 10 includes a reflective electrode 20 that is arranged on a substrate 1 and reflects light, an organic layer 30 arranged on the reflective electrode 20, a semi-transmissive electrode 40 arranged on the organic layer 30, and an interference adjustment layer 50 that is arranged on the semi-transmissive electrode 40 and has a multilayer structure. Each light emitting element 10 according to this embodiment is a top-emission type light emitting element that extracts light from the semi-transmissive electrode 40 arranged with respect to the reflective electrode 20 with the organic layer 30 sandwiched between them. The organic layer 30, which is to be described later, emits white light. The interference adjustment layer 50 has a multilayer structure formed of three or more layers. In the arrangement shown in FIG. 1, the interference adjustment layer 50 has a three-layer structure including a first layer 51 which is in contact with the semi-transmissive electrode 40, a second layer 52 which is arranged on the first layer 51 and in contact with the first layer 51, and a third layer 53 which is arranged on the second layer 52 and in contact with the second layer 52. In this embodiment, the third layer 53 functions as a sealing layer for protecting the organic layer 30 from moisture or the like included in the atmosphere.

The organic device 100 includes color filters 60 arranged on the interference adjustment layer 50. The color filters 60 include, as shown in FIG. 1, color filters 60R, 60G, and 60B that transmit red light, green light, and blue light, respectively. As a result, the organic device 100 can form a display apparatus that performs color display.

A metal material whose reflectance with respect to the wavelength of emitted light of the organic layer 30 is equal to or more than 80% can be used as the reflective electrode 20. More specifically, a metal such as aluminum (Al) or the like or an alloy obtained by adding a metal such as Al to silicon (Si), copper (Cu), nickel (Ni), neodymium (Nd), or the like can be used. Although details will be described later, to employ a lowest-order interference structure that can increase the light intensity of blue light of a wavelength of about 450 nm, a metal such as Al or the like whose plasmon frequency is in the ultraviolet region can be used, from the point of view of surface plasmon loss, as the reflective electrode 20. For example, silver (Ag) or a silver alloy will increase surface plasmon loss, the reflective electrode 20 need not contain Ag.

The reflective electrode 20 can also be a multilayer film which is made by layering an Al which has a high reflectance, an AL alloy, and a barrier metal. A material with a high hole-injection property can be used as the barrier metal. More specifically, metals such as titanium (Ti), tungsten (W), molybdenum (Mo), gold (Au), or the like or alloys thereof can be used. The barrier metal can be formed by, for example, sputtering or the like. When the barrier metal is to be formed, oxide film formation on the surface of a metal, such as Al on which an oxide film can be formed easily, can be suppressed, and thus an increase in the voltage to be applied to the reflective electrode 20 can be suppressed.

The organic layer 30 includes a hole injection transport layer 31, a light emitting layer 32 containing an organic light emitting material, and an electron injection transport layer 33. Hence, the light emitting element 10 can be an organic EL light emitting element. Each of the hole injection transport layer 31 and the electron injection transport layer 33 may have a single layer structure or may have a multilayer structure formed by a plurality of layers.

In this embodiment, the light emitting layer 32 is a light emitting layer that emits white light. The light emitting layer 32 may be formed by a single layer or a plurality of layers. Although the arrangement shown in FIG. 1 shows an arrangement in which the light emitting layer 32 is formed by layering a light emitting layer 32a and the light emitting layer 32b, three or more light emitting layers may be included. In a case in which the light emitting layer 32 is to have a multilayer structure, the plurality of light emitting layers may be in contact with each other or a non-light emitting intermediate layer may be sandwiched between the layers.

As shown in FIG. 1, in a case in which the light emitting layer 32 includes the two light emitting layers 32a and 32b, the light emitting layer 32a (or the light emitting layer 32b) can be the light emitting layer which contains a blue light emitting material, and the light emitting layer 32b (or the light emitting layer 32a) can be the light emitting layer which contains a green light emitting material and a red light emitting material. Also, for example, the light emitting layer 32a (or the light emitting layer 32b) may be the light emitting layer which contains the green light emitting material and the red light emitting material, and the light emitting layer 32b (or the light emitting layer 32a) may be the light emitting layer which contains the blue light emitting material. In addition, in a case in which the light emitting layer 32 contains three light emitting layers, a light emitting layer which contains the red light emitting material, the light emitting layer which contains the blue light emitting material, and the light emitting layer which contains the green light emitting material may be included separately. The light emitting layers may be arranged, from the side of the reflective electrode 20, in the order of the light emitting layer which contains the red light emitting material, the light emitting layer which contains the blue light emitting material, and the light emitting layer which contains the green light emitting material. Alternatively, the light emitting layers may be arranged in an order which is reverse of the aforementioned order, or the light emitting layer which contains the blue light emitting material may be arranged at the edge of the light emitting layer 32. Also, for example, the above-described intermediate layer may be included between the light emitting layer which contains the red light emitting material and the light emitting layer which contains the blue light emitting material.

Each layer of the light emitting layer 32 may be formed by one type of compound or by a plurality of types of compounds. More specifically, the light emitting layer 32 may contain a host compound and a guest compound. The host compound is a compound with the highest weight ratio in the light emitting layer 32, and the guest compound is a main compound (organic light emitting material) in charge of light emission.

A known organic compound can be used as the host. For example, a naphthalene derivative, a chrysene derivative, a pyrene derivative, a fluorene derivative, a fluoranthene derivative, a metal complex, a triphenylene derivative, a dibenothiophene derivative, a dibenofuran derivative, and the like can be used as the host compound. The host can be an organic compound made of one of these derivatives or an organic compound obtained by combining a plurality of these derivatives. An organic compound containing naphthalene and pyrene, an organic compound containing fluorene and pyrene, or an organic compound containing chrysene and triphenylene is suitable as the host compound.

The hole injection transport layer 31 can contain a known hole transport material. For example, a naphthalene derivative, a phenanthrene derivative, a chrysene derivative, a pyrene derivative, a fluorene derivative, a fluoranthene derivative, a metal complex, a triphenylene derivative, a dibenothiophene derivative, a dibenofuran derivative, and the like can be used as the hole injection transport layer 31. The hole injection transport layer 31 can contain an organic compound made of one of these derivatives or an organic compound obtained by combining a plurality of these derivatives. The hole injection transport layer 31 can also contain a nitrogen atom between each of the above described derivatives. Diarylamine containing naphthalene and chrysene or diarylamine containing fluorene and naphthalene is suitable as the hole injection transport layer 31.

The semi-transmissive electrode 40 functions as a semi-transmissive reflection layer that has a property (that is, a semi-transmissive reflection property) of partially transmitting and partially reflecting light which has reached the surface of the electrode. The semi-transmissive electrode 40 can be made of an alkali metal, an alkaline earth metal, or an alloy containing these metals. More specifically, a metal such as magnesium, silver, or the like or an alloy mainly containing magnesium and silver can be used as the semi-transmissive electrode 40.

The third layer 53 of the interference adjustment layer 50 is a sealing layer that protects the organic layer 30 from moisture as described above. The third layer 53 can have a single layer structure or a multilayer structure. The third layer 53 (sealing layer) can be made of, for example, silicon oxide ($SiO_2$), silicon nitride ($SiN_x$), silicon oxynitride (SiON), aluminum oxide ($Al_2O_3$), or the like. The third layer 53 can be formed by, for example, vapor deposition, sputtering, atomic layer deposition, or the like. A material, among the above-described materials, in which the refractive index becomes 1.9 or more at a wavelength λb (approximately 450 nm) (to be described later) can be used as the third layer 53.

Each color filter 60 is a filter that cuts off light of a wavelength other than light of an arbitrary wavelength emitted from the light emitting layer 32, that is, a filter that transmits light of an arbitrary wavelength. Each color filter 60 can be formed by a known method. As shown in FIG. 1, a color filter corresponding to the light emission color of each light emitting element 10 can be included in each light element. In addition, from the point of view of protection of the organic device 100, a protection layer (not shown) such as protection glass can be arranged on each color filter 60.

In the embodiment, each light emitting element 10 is designed so that the emission light color will be controlled by optical interference and light will radiate with higher efficiency in a front direction by setting the film thickness of the organic layer 30 to have a particularly high luminance in the front direction. In this case, the front direction is the upward direction in FIG. 1. In addition, a wavelength in which light radiation can be strengthened by optical interference may be referred to as a resonant wavelength hereinafter.

Interference (resonance) for strengthening radiation can be set by adjusting, with respect to light of a wavelength λ, a distance $d_0$ from a light emission position of the light emitting layer 32 to a reflection surface of the reflective electrode 20 to $d_0 = i\lambda/4n_0$ (i=1, 3, 5 . . . ). As a result, components in the front direction will increase in the light radiation distribution of the wavelength λ, thus improving the front surface luminance. In this case, $n_0$ is an effective refractive index of the wavelength λ in the layer from the light emission position to the reflection surface. In this embodiment, assume that the refractive index is the refractive index of a light of 450 nm.

Next, an optical distance Lr, for causing the light of the wavelength λ to resonate, from the light emission position of the light emitting layer 32 to the reflection surface of the reflective electrode 20 will be described. In this case, an "optical distance" indicates the total sum of products obtained between a refractive index of each layer and a thickness $d_j$ of each layer. For example, an optical distance L of the organic layer 30 shown in FIG. 1 can be expressed as $$L = \Sigma n_j \times d_j$$
$$= n_{31} \times d_{31} + n_{32a} \times d_{32a} + n_{32b} \times d_{32b} + n_{33} \times d_{33}$$

The optical distance of each component other than the organic layer 30 can be obtained by the total sum of products obtained between the refractive index of each layer and the thickness $d_j$ of each layer. In addition, since the luminance in the front surface direction will be described in the above manner, the thickness $d_j$ of each layer can be, as shown in FIG. 1, a thickness in the normal direction with respect to the surface on which the reflective electrode 20 of the substrate 1 is formed.

Letting φr [rad] be a sum of a phase shift amount when the light of the wavelength λ is reflected by the reflection surface of the reflective electrode 20, the optical distance Lr from the light emission position of the light emitting layer 32 to the reflection surface on the reflective electrode 20 is expressed as follows $$Lr=(2m-(\phi r/\pi))\times(\lambda/4)=-(\phi r/\pi))\times(\lambda/4) \qquad (1)$$

where m is a non-negative integer. In addition, φ is a negative value. In this embodiment, m=0 is set to use the lowest interference condition in the point of view of driving voltage reduction of the organic device 100. Letting φ=−π and m=0, Lr=λ/4. The condition of m=0 according to the above-described equation may be described as a λ/4 interference condition hereinafter.

Next, letting φs [rad] be a sum of a phase shift amount when the light of the wavelength λ is reflected by the reflection surface of the semi-transmissive electrode 40, an optical distance Ls from the light emission position on the light emitting layer 32 to the reflection surface (the surface (lower surface) of the semi-transmissive electrode 40 on the side of the substrate 1) of the semi-transmissive electrode 40 is expressed as follows $$Ls=(2m'-(\phi s/\pi))\times(\lambda/4)=-(\phi s/\pi))\times(\lambda/4) \qquad (2)$$

where m' is a non-negative integer.

Hence, the optical distance L of the whole organic layer 30 that causes the light of the wavelength λ to resonate (strengthen) can be expressed as follows $$L=(Lr+Ls)=(\phi/\pi)\times(\lambda/4) \qquad (3)$$

where φ is a phase shift amount sum (φr+φs) obtained when the light of the wavelength λ is reflected by the reflective electrode 20 and the semi-transmissive electrode 40. Equation (3) is an interference referred to as a "whole layer interference" of the organic layer 30, and is the (λ/4) interference condition that strengthens the light of wavelength λ of the whole organic layer 30. In addition, the optical distance from the reflective electrode to the semi-transmissive electrode can be said to be the optical distance of the whole organic layer 30. In this case, the optical distance can be from the reflection surface on the semi-transmissive electrode side of the reflective electrode to the reflection surface on the reflective electrode side of the semi-transmissive electrode.

In this embodiment, in the point of view of gamut expansion of the display color of the organic device 100, the wavelength of the light to be extracted will be set as the wavelength λb, which is the shortest wavelength among the peak wavelengths in the light emission spectrum of the blue light emitting layer. The wavelength λb is about 450 nm. In this case, assuming that the refractive index of the organic layer 30 is about 1.7 to 2.0, the film thickness of the organic layer 30 will be about 70 nm based on equation (3). If the film thickness of the organic layer 30 is reduced to about 70 nm, the organic layer 30 may not be able to cover small unevenness such as very small foreign objects and separation films between the respective light emitting elements 10. Hence, leakages and short circuits may occur more frequently between the light emitting elements 10. As a result of consideration, the inventors have found that the yield of the organic device 100 will be degraded exponentially when the film thickness of the organic layer 30 is reduced to about 90 nm or less. Hence, the inventors have considered and found a structure that can increase the film thickness of the organic layer 30 while maintaining the chromaticity of the blue light emitting pixel (to be referred to as a B pixel hereinafter) by incorporating the interference adjustment layer 50 (to be described later) which has a multilayered structure.

The λ/4 interference condition of the whole layer interference of the organic layer 30 according to this embodiment can be expressed, with respect to the wavelength λb which is the smallest wavelength in the blue spectrum, based on equation (3) as follows $$L = (\lambda/\pi) \times (\lambda b/4) \times A \quad (4)$$

where a coefficient A is an interference condition of the whole organic layer 30, and is a coefficient that serves as an index representing how much larger the film thickness the organic layer 30 has increased than the λ/4 interference condition of the wavelength λb. From the point of view of leakage and short circuit prevention described above, the coefficient A may be set to 1.2 or more. In this case, $$L \geq [\{(\phi r + \phi s)/\pi\} \times (\lambda b/4)] \times 1.2$$

Also, the coefficient A may be set to 1.3 or more. In this case, $$L \geq [\{(\phi r + \phi s)/\pi\} \times (\lambda b/4)] \times 1.3$$

Furthermore, the coefficient A may be set to 1.35 or more. In this case, $$L \geq [\{(\phi r + \phi s)/\pi\} \times (\lambda b/4)] \times 1.35$$

The film thickness of the organic layer 30 can be, for example, 85 nm or more based on the relationship between this coefficient A and the refractive index described above. In addition, the film thickness of the organic layer 30 may be 90 nm or more. Furthermore, the film thickness of the organic layer 30 may be 100 nm or more. By increasing the film thickness of the organic layer 30, the yield will improve when the light emitting elements 10 are to be manufactured. However, as the coefficient A of equation (4) increases, the resonant wavelength that strengthens the light of a specific wavelength of the organic layer 30 will shift to the long wavelength side from the wavelength λb. In a case in which the coefficient A is about 1.2, the resonant wavelength will strengthen the green region (λ=500 nm). As will be described later, by using the interference adjustment layer 50 which has a multilayered structure according to this embodiment, the light of the wavelength λb of the blue region can be strengthened even if the organic layer 30 has a film thickness in which the resonant wavelength falls in the green region.

The interference adjustment layer 50 will be described next. In this embodiment, each of the first layer 51, the second layer 52, and the third layer 53 included in the interference adjustment layer 50 is formed by a dielectric. Patent literature 1 discloses that the film thickness of each layer of a dielectric multilayer film, when the resonant wavelength is set to λ, is set to a film thickness in which the optical distance of each layer will be (2m−1)×λ/4 (m is a non-negative integer). However, in this embodiment, to increase the light of the wavelength λb with respect to the organic layer 30 in which the resonant wavelength is in the green region away from the wavelength λb, a condition that falls outside the setting condition from the film thickness shown in patent literature 1 is necessary. Hence, in this embodiment, an optical distance L1 of the first layer 51 will be set as $$L1 = (\lambda b/4) \times B \quad (5)$$

where a coefficient B is a coefficient that serves as an index representing how much the first layer 51 has shifted the resonant wavelength closer to the short wavelength side by the interference condition of the first layer 51 than the λ/4 interference condition of the wavelength λ. In addition, in this embodiment, m=0 will be set from the point of view of suppressing a change in the characteristics of the organic device 100 due to the film change of the first layer 51. The coefficient B may be 0.9 or less. In this case, $$L1 \leq (\lambda b/4) \times 0.9$$

At this time, the above-described coefficient A can be 1.2 or more. In addition, the coefficient B can be 0.8 or less. In this case, $$L1(\lambda b/4) \times 0.8$$

At this time, the above-described coefficient A can be 1.3 or more. Furthermore, the coefficient B can be 0.75 or less. In this case, $$L1(\lambda b/4) \times 0.75$$

At this time, the above-described coefficient A can be 1.35 or more.

In addition, in this embodiment, a refractive index $n_1$ of the wavelength λb of the first layer 51 can be higher than a refractive index $n_2$ of the wavelength λb of the second layer 52. Also, a refractive index $n_3$ of the wavelength λb of the third layer 53 can be higher than the refractive index $n_2$ of the wavelength λb of the second layer 52. Furthermore, as will be described later, a difference between the refractive index $n_1$ of the wavelength λb of the first layer 51 and the refractive index $n_2$ of the wavelength λb of the second layer 52 can be 0.58 or more. Regarding the material of the first layer 51, the second layer 52, and the third layer 53, any material will be sufficient as long as the refractive index condition described above is satisfied, and an inorganic material or an organic material may be used. More specifically, a material which has a high refractive index can be used as the material of each of the first layer 51 and the third layer 53. For example, an inorganic material such as $SiO_2$ (which has a refractive index of about 1.5), $SiN_x$ (which has a refractive index of about 1.9 to 2.1), SiON (which has a refractive index of about 1.6 to 2.0), titanium oxide ($TiO_2$) (which has a refractive index of about 2.5), indium tin oxide (ITO) (which has a refractive index of about 1.8 to 2.0), zinc sulfide (ZnS) (which has a refractive index of about 2.4), $Al_2O_3$ (which has a refractive index of about 1.8), or the like can be used or an organic material such as a triamine derivative or the like can be used as the material of each of the first layer 51 and the third layer 53. Also, a material that has a low refractive index can be used as the material of the second layer 52. For example, an inorganic material such as magnesium fluoride (MgF$_2$) (which has a refractive index of about 1.4), lithium fluoride (LiF) (which has a refractive index of about 1.4), or the like or an organic compound (for example, fluoropolymer (which has a refractive index of about 1.1 to 1.4) or the like) can be used as the material of the second layer 52. A mixture of these materials can also be used as the material of the second layer 52.

Each layer included in the interference adjustment layer 50 need not be limited to a dielectric. A case in which each of the first layer 51 and the third layer 53 is made of a dielectric and the second layer 52 is made of a metal in the interference adjustment layer 50 will be described next. The embodiment described above in which each layer included in the interference adjustment layer 50 is a dielectric will be referred to as the "first embodiment", and an embodiment to be described below in which the second layer 52 is a metal will be referred to as "the second embodiment" in some case hereinafter.

Conventionally, letting λ be a wavelength (resonant wavelength) to be strengthened, the film thickness of a first layer 51 provided between a semi-transmissive electrode 40 and a second layer 52 made of a metal will be set to a film thickness which becomes (2m−1)*λ/e (m is a non-negative integer). However, in this second embodiment, to increase the light of a wavelength λb with respect to an organic layer 30 in which the resonant wavelength is in the green region away from the wavelength λb as described above, an optical distance L1' of the first layer 51 can be set as $$L1'=(\lambda b/2)\times C \quad (6)$$

where a coefficient C is a coefficient that serves as an index representing how much the first layer 51 has been shifted closer to the short wavelength side from the interference condition which increases the wavelength λb. The coefficient C can also be 0.8 or less. In this case, it can be expressed as $$L1'(\lambda b/2)\times 0.8$$

In this case, a coefficient A described above can be 1.2 or more. Furthermore, the coefficient C can be 0.7 or less. In this case, it can be expressed as $$L1'(\lambda b/2)\times 0.7.$$

In this case, the coefficient A described above can be 1.3 or more.

In a case in which the second layer 52 is made of a metal, from the point of view of surface plasmon loss, a refractive index $n_1$ of the first layer 51 may be 1.6 or more. Regarding the material of the first layer 51 and a third layer 53, any material will be sufficient as long as the refractive index condition described above is satisfied, and an inorganic material or an organic material may be used. More specifically, an inorganic material, for example, $SiN_x$, SiON, $TiO_2$, ITO, ZnS, or the like can be used or an organic material such as a triamine derivative or the like can be used as the material of each of the first layer 51 and the third layer 53.

The second layer 52 functions has a semi-transmissive reflection layer which has a property (that is, semi-transmission reflection property) of transmitting one part of light that has reached the surface and reflecting the remaining other part of the light. Although Ag or an alloy of Ag and magnesium (Mg) can be used as the material of the second layer 52, only Ag may be used from the point of view of absorption. However, since a film may coagulate after film formation when a thin film made of Ag is used, an alloy with another metal and a metal film, which is made of calcium (Ca) or the like and provided under (on the side of the first layer 51 of) the Ag film, may be arranged separately in the point of view of improving the coverage of the second layer 52. In this case, this stacked structure made of these metal films may be referred to as the second layer 52.

The details of the embodiments have been described above. In a case in which the light of the peak wavelength λb which is the shortest wavelength of the blue emitted light is to be extracted, the film thickness of an organic layer 30 is reduced to 70 nm so an organic film will not be able to cover small unevenness such as very small foreign objects and separation films between respective light emitting elements 10, and yield degradation will problematically occur. On the other hand, if the film thickness of the organic layer 30 is increased based on a λ/4 interference condition, the resonant wavelength will shift to the long wavelength side and the chromaticity of a B pixel will deteriorate, thus degrading the color reproduction range. That is, there is a clear tradeoff relationship between the chromaticity of the B pixel and the maintenance of the yield due to increasing the thickness of the organic layer 30. In each embodiment, an interference adjustment layer 50 which has a multilayer structure is arranged on a semi-transmissive electrode 40. Furthermore, by setting the film thickness (optical distance) of a first layer 51, of the interference adjustment layer 50, to have a film thickness in which the resonant wavelength will be a wavelength shorter than a minimum peak wavelength λb of blue emitted light, it has been found that the chromaticity of blue can be maintained regardless of the increase in the film thickness of the organic layer 30. That is, the resonant wavelength of the optical distance between the organic layer 30 and the reflection surface of the interference adjustment layer 50 which is formed on the semi-transmissive electrode 40 will be made shorter than the wavelength λb. The reflection surface of the interference adjustment layer 50 will be described here. As will be described later, it is considered that a second layer 52 has a smaller influence on light extraction than the first layer 51, and a third layer 53 does not to contribute to optical interference because it is thicker than the visible light wavelength. Hence, the reflection surface of the interference adjustment layer 50 which is formed on the semi-transmissive electrode 40 and the organic layer 30 can be the interface between the first layer 51 and the second layer 52 (to be sometimes referred to as a reflection surface 54 hereinafter). As a result, it has been found that the film thickness of the organic layer 30 can be increased to maintain the yield, and that both the improvement of the reliability and the color reproduction range of an organic device 100 can be implemented. Also, it is suitable to improve the chromaticity of blue to improve color reproducibility. Thus, for example, it may be arranged so that, in a case in which the light emission spectrum of the blue light emitting material has a first peak and a second peak which is smaller than the first peak, the minimum wavelength of the interference spectrum of each light emitting element will be closer to the wavelength of the second peak than the wavelength of the first peak. The chromaticity of blue can be improved by setting an arrangement that reduces the second peak.

Figure 3:
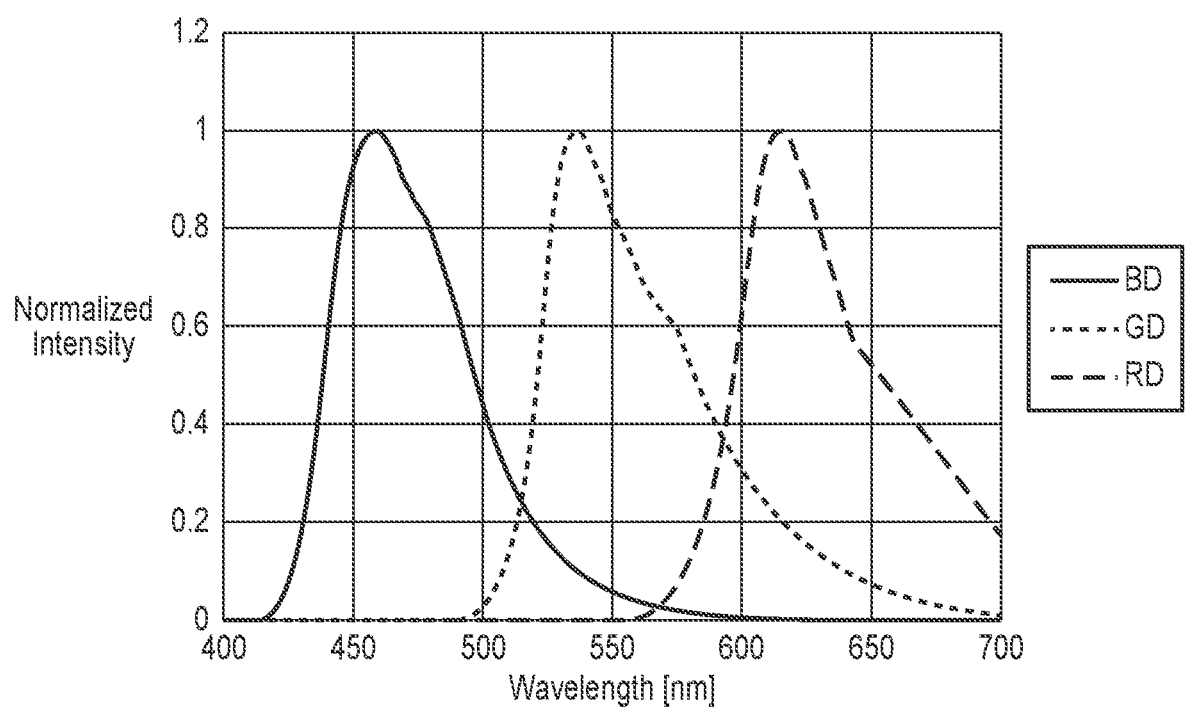
FIG. 3 is a graph showing a PL spectrum of the organic device according to FIG. 1.
Figure 4:
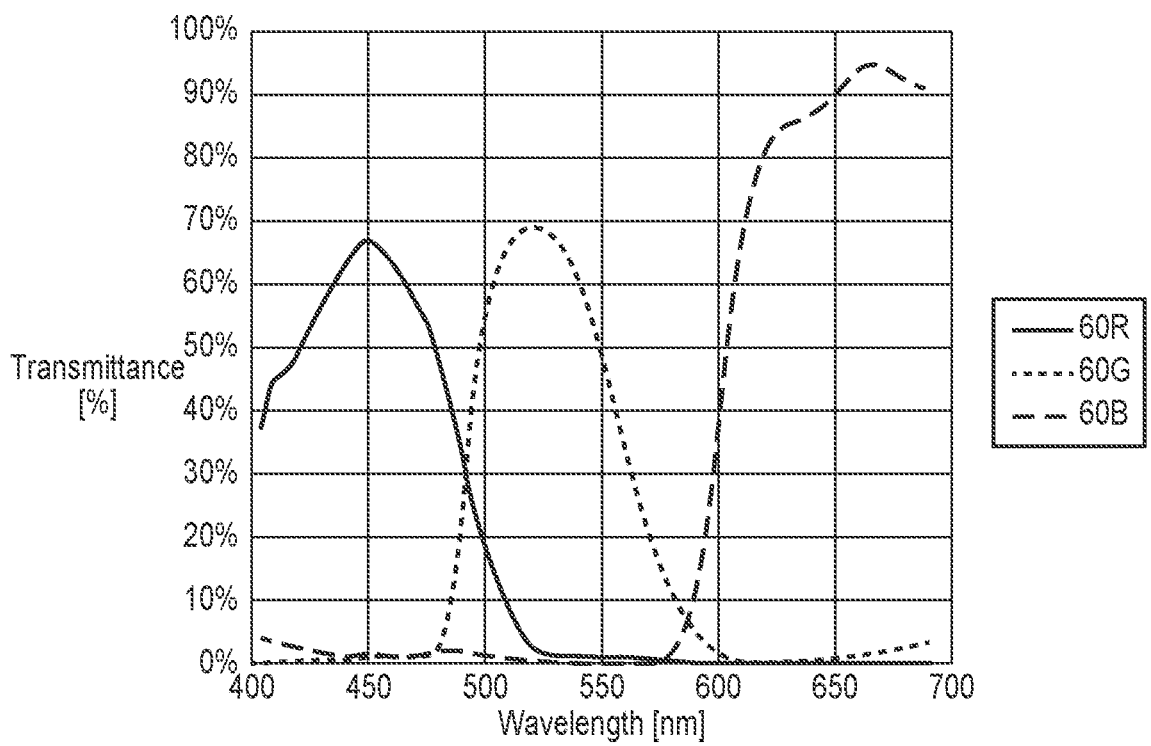
FIG. 4 is a graph showing transmittances of color filters of the organic device according to FIG. 1.

The effects of each embodiment will be described next by using a simulation. FIG. 3 shows the PL spectrums of a red light emitting dopant (to be sometimes referred to as RD hereinafter), a green light emitting dopant (to be sometimes referred to as GD hereinafter), and a blue light emitting dopant (to be sometimes referred to as BD hereinafter), respectively, which are used in each/the embodiment. Each PL spectrum has been normalized at the maximum peak value. FIG. 4 shows the relationship between the transmittance and the wavelength of each of color filters 60R, 60G, and 60B used in each embodiment. The PL spectrum of each color shown in FIG. 3 and the transmittance of each color filter 60 shown in FIG. 4 are not limited to materials that have each exemplified spectrum, and materials can be combined and used as needed in accordance with the characteristic of each light emitting element 10 such as the gamut.

In each embodiment, a multi-objective optimization calculation was performed by using, as variables, the film thicknesses of the semi-transmissive electrode 40, a hole injection transport layer 31, and an electron injection transport layer 33, respectively, and exciton generation ratios $\gamma_b$, $\gamma_g$, and $\gamma_r$ of BD, GD, and RD, respectively. FIG. 18 shows the film thickness of each charge transport layer and the lower limit and the upper limit of exciton generation ratios $\gamma$ of BD and GD. In the following analysis, unless otherwise mentioned, a light emitting layer 32 has as stacked arrangement formed by a light emitting layer 32a and a light emitting layer 32b as exemplified in FIG. 1. The light emitting layer 32a is a light emitting layer containing a mixed dopant with GD and RD (to be sometimes referred to as GD+RD hereinafter), and the light emitting layer 32b is a light emitting layer including BD. Each of the light emitting layer 32a and the light emitting layer 32b has a film thickness of 10 nm. In each embodiment, the light emitting layer 32 suffices to include a light emitting layer that emits blue light (a light emitting layer that includes BD) and to emit white light as the light emitting layer 32 overall. An appropriate stacking order and arrangement of the light emitting layer 32 can be used in accordance with the required performance of each light emitting element 10. That is, for example, it may be arranged so that the light emitting layer 32a is doped with BD and the light emitting layer 32b is doped with a mixture of GD and RD. 0.82 has been assumed here to be the light emission yield in each of BD bulk, GD bulk, and RD bulk. The light emission yield in bulk is the light emission yield of the light emitting dopant when optical interference is not present.

In addition, unless otherwise mentioned, a reflective electrode 20 of this analysis has a stacked structure made of Al/Ti. In this case, assume that the film thickness of Ti which is a barrier metal arranged between Al and organic layer 30 is 10 nm. Assume that the semi-transmissive electrode 40 is an MgAg alloy electrode. Also, as described above, assume that the wavelength λb to be extracted is 450 nm, and in a case in which the reflective electrode 20 is an Al electrode (the Al/Ti stacked electrode will be sometimes simply referred to as the Al electrode hereinafter), the λ/4 interference condition of equation (3) is about 145 nm. In addition, in a case in which the reflective electrode 20 is an Ag electrode, the λ/4 interference condition is about 135 nm. The coefficient A of the whole organic layer 30 shown in equation (4) can be calculated from the λ/4 interference condition with respect to the optical distance L and the wavelength λb of the organic layer 30.

The optical simulation used a CSP method. The CSP method is a method well known in the field of organic EL. The multi-objective optimization algorithm was performed by NESA+, and a multi-objective optimization calculation was performed using an objective function in which the coefficient A will have maximum value and a chromaticity v' of the B pixel will have a minimum value. A chromaticity u'>0.45 of the red light emitting pixel (to be sometimes referred to as the R pixel hereinafter) and a chromaticity u'<0.13 of the green light emitting pixel (to be sometimes referred to as the G pixel hereinafter) were set as constraint functions of the multi-objective optimization. Furthermore, the carrier balance was assumed to be 1, and each exciton generation ratio γ was adjusted so that the sum of the exciton generation ratios γ will be 1 ($\gamma_b+\gamma_g+\gamma_r=1$).

In the calculation of the power consumption of the panel, the aperture ratio of each pixel was set to 50%, and the aperture ratio of the light emitting element 10 is uniformly set to 16.7% for each of red, green, and blue light emitting elements. Power necessary for the organic device 100 having a panel size of 0.5 to emit white light of a color temperature of 6,800 K at a luminance of 200 cd/cm$^2$ is calculated. More specifically, the chromaticity and the light emission efficiency of white light were obtained to calculate the required current for each of red light, green light, and blue light. In this analysis, the driving voltages was assumed to be 10 V, and the power consumption was calculated from the required current value.

Figure 5:
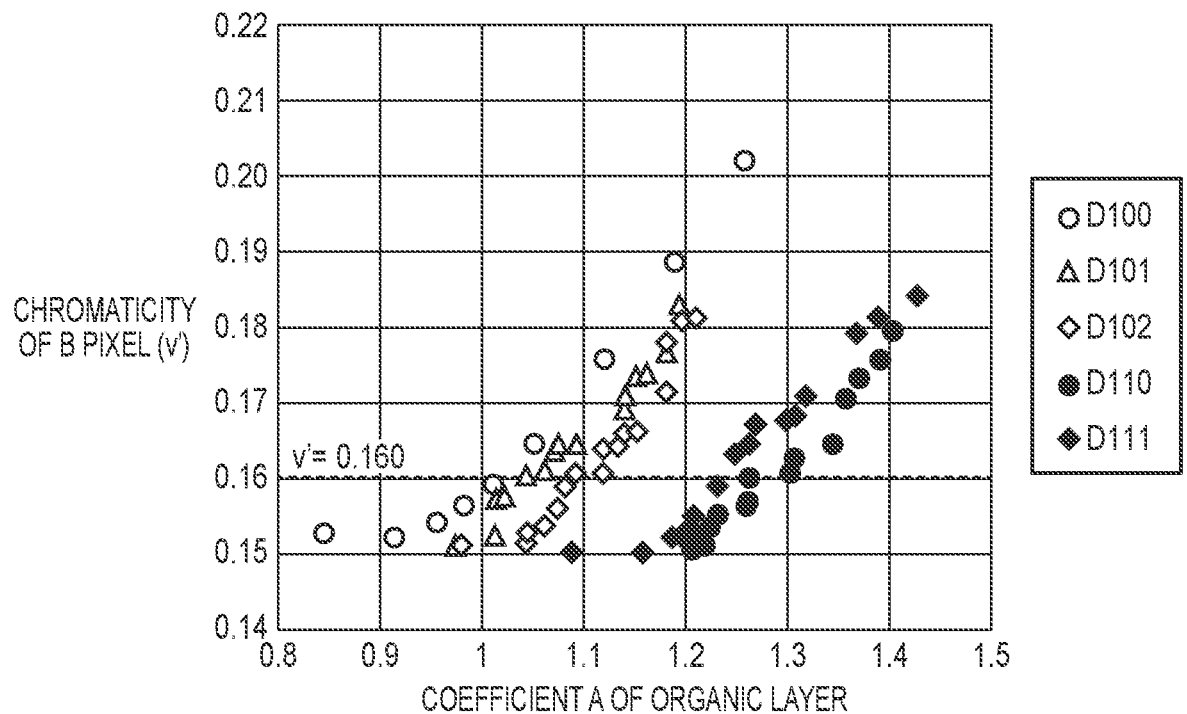
FIG. 5 is a graph showing relationship between a coefficient A of an organic layer and a chromaticity v' of a B pixel of the organic device according to FIG. 1 and those of organic devices according to comparative examples.

The analysis result of the first embodiment will be described first. First, it will be shown that the effect of the interference adjustment layer 50 having a multilayer structure can be first expressed by setting a three-layer arrangement. FIG. 5 shows a Pareto optimal solution of the coefficient A and a chromaticity v' of the B pixel with respect to the combination of each layer of the interference adjustment layer 50 shown in FIG. 19. As shown in FIG. 19, reference symbol D100 denotes a light emitting element of a comparative example in which the interference adjustment layer 50 which has a multilayer structure is absent (only the third layer 53 functioning as the sealing layer is present), and each of reference symbols D101 and D102 denotes a light emitting element of the comparative example in which the second layer 52 is not arranged. Also, each value shown in FIG. 19 is a refractive index of each layer of λb=450 nm. In this case, a light extinction coefficient κ has been omitted because it is sufficiently small and does not influence the optical characteristic. In addition, light emitting elements D110 and D111 are shown as examples of the first embodiment.

In FIG. 5, the calculation was performed by using exciton generation ratios $\gamma_b$, $\gamma_g$, and $\gamma_r$ of BD, GD, and RD, respectively, as variables. That is, FIG. 5 shows the result in which the RGB light emission ratios have been optimized so that the coefficient A will have a maximum value and the chromaticity v' of the B pixel will have a minimum value.

As shown in FIG. 5, in the element D100 without the interference adjustment layer 50, the chromaticity v' of the B pixel increases as the coefficient A increases (that is, the total film thickness of the organic layer 30 increases) so that the chromaticity v' of the B pixel is 0.16 when the coefficient A=1 and the chromaticity v' of the B pixel is 0.19 when the coefficient A=1.2. Considering that the chromaticity v' of the B pixel is 0.158 in sRGB, this result represents that the color reproduction range is reduced as the value increases. That is, it shows that there is a clear tradeoff relationship between the coefficient A and the chromaticity v' of the B pixel. In the following discussion, the index value of the chromaticity of the B pixel will be assumed to be v'=0.160.

When v'=0.160 in the elements D101 and D102 which do not include the second layer 52, A=1.05 and A=1.1, respectively, and it can be seen that the increase in the coefficient A is small compared to the element D100 which has the same chromaticity v' of the B pixel. That is, in the elements D101 and D102, it can be seen that the tradeoff relationship between the coefficient A and the chromaticity v' of the B pixel is the almost the same such as that of the element D100.

On the other hand, in the elements D110 and D111 according to the examples of the first embodiment, the coefficient A=1.3 (D110) and the coefficient A=1.25 (D111), respectively, when the chromaticity v' of the B pixel is 0.160, and it can be seen that the coefficient A has increased more than the comparative examples in which the coefficient A is 1.1 or less. That is, by arranging the first layer 51, the second layer 52, and the third layer 53 as the interference adjustment layer 50, the tradeoff relationship between the coefficient A and the chromaticity v' of the B pixel can change. As a result, the increase in the chromaticity v' of the B pixel can be suppressed even if the film thickness of the organic layer 30 is increased, and it is possible to improve the reliability to the organic device 100 and achieve good chromaticity v' of the B pixel.

The film thicknesses of the first layer 51 and the second layer 52 expressing the effect of the embodiment will be described next. The third layer 53 generally has a film thickness of 1 μm or more to function has a sealing layer for maintaining a moisture resistance property as described above. Since the third layer 53 is thicker than the visible light wavelength and can considered to be a non-interference layer which does not contribute to optical interference, a description thereof will be omitted here.

Figure 6:
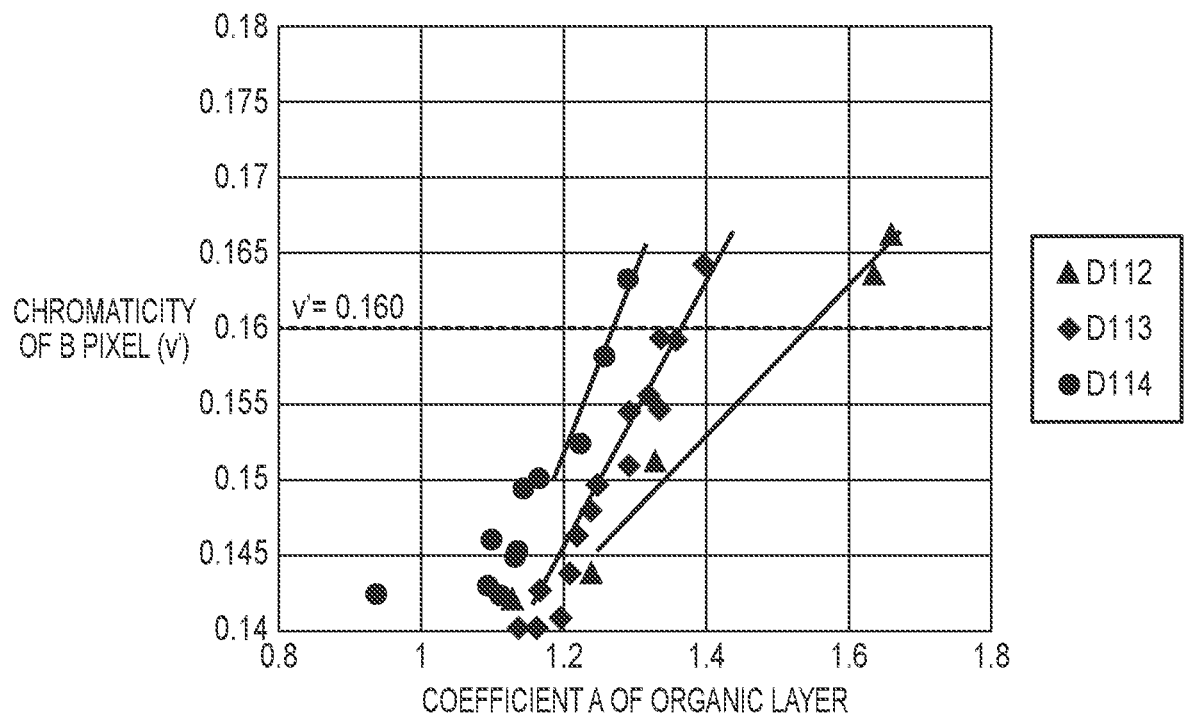
FIG. 6 is a graph showing the relationship between the coefficient A of an organic layer and the chromaticity v' of a B pixel of each organic device according to FIG. 1.
Figure 7:
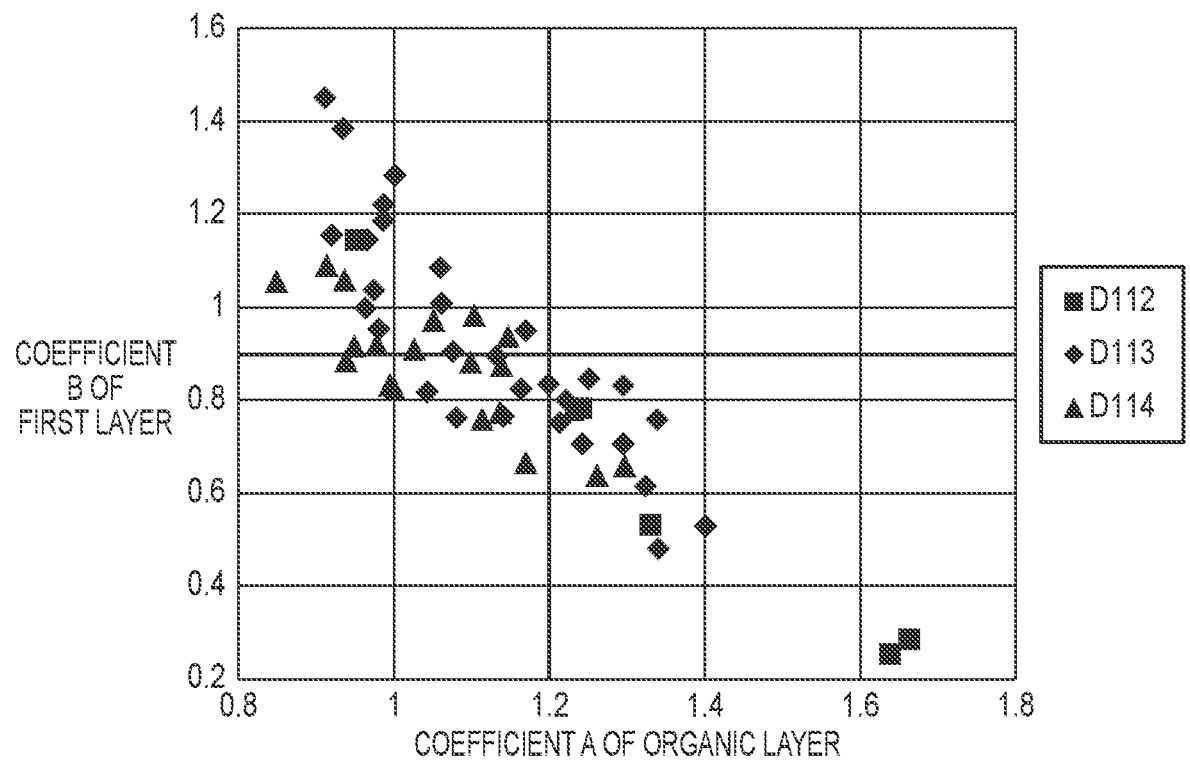
FIG. 7 is a graph showing the relationship between the coefficient A of the organic layer and a coefficient B of a first layer of each organic device according to FIG. 1.

FIG. 6 shows a Pareto optimal solution of the coefficient A and the chromaticity v' of the B pixel of each of elements D112 to D114, according to the examples of the embodiment, obtained when the refractive index of each layer of the interference adjustment layer 50 shown in FIG. 20 has been changed. Also, FIG. 7 shows the coefficient B of the first layer 51 of the Pareto optimal solution element arrangement of FIG. 6. In this case, to clarify the relationship related to the film thickness of the first layer 51, a calculation was performed by fixing the exciton generation ratios of BD, GD, and RD to $\gamma_b$=0.48, $\gamma_g$=0.28, and $\gamma_r$=0.24, respectively.

In the elements D112, D113, and D114 shown in FIG. 6, the coefficient A=1.55 (D112), the coefficient A=1.38 (D113), and the coefficient A=1.25 (D114), respectively, when the chromaticity v' of the B pixel is 0.160. That is, for each of the elements D112, D113, and D114, it can be seen that the coefficient A has increased more than D100 of the comparative example in which the coefficient A=1. That is, this represents that the film thickness of the organic layer 30 can be increased while maintaining the chromaticity v' of the B pixel.

FIG. 7 shows the B coefficient of the first layer 51 according to the Pareto optimal solution shown in FIG. 6. That is, the relationship between the coefficient A of the organic layer 30 and the coefficient B of the first layer 51 is shown. From FIG. 7, it can be seen that the coefficient B of the first layer 51 is set to about 1 when the coefficient A is 1. That is, the optimal film thickness of the first layer 51 is λb/4 in a case in which the film thickness of the organic layer 30 is a film thickness based on the λb/4 interference condition. On the other hand, the optimal value of the coefficient B of the first layer 51 decreases when the coefficient A increases. That is, in a case in which the film thickness of the organic layer 30 is to become thicker than the resonant wavelength of λb/4, the film thickness of the first layer 51 is preferably set so that the film thickness of the first layer 51 will be smaller than the λb/4 optical condition. In other words, the resonant wavelength of the first layer 51 can be shorter than the wavelength λb. In this embodiment, if the coefficient A is to be set to be 1.2 or more in the point of view of the yield, the coefficient B of the first layer 51 may be set to 0.9 or less based on the calculation result of FIG. 7. In addition, it may be set so that the coefficient A of the organic layer 30 will be 1.3 or more and the coefficient B of the first layer 51 will be 0.8 or less. The refractive index of the above-described material used as the first layer 51 is about 1.5 to 2.4. Hence, based on the relationship between the coefficient B and the refractive index, the film thickness of the first layer 51 can be set to, for example, 50 nm or less. The film thickness of the first layer 51 may also be set to 40 nm or less. As shown in FIG. 18, the film thickness of the first layer 51 can be set to fall within a range of 10 nm (inclusive) to 250 nm (inclusive). Furthermore, for example, a material whose refractive index is 1.6 or more such as $SiN_x$, SiON, $TiO_2$, ITO, ZnS, or the like can be used for the first layer 51.

Figure 8:
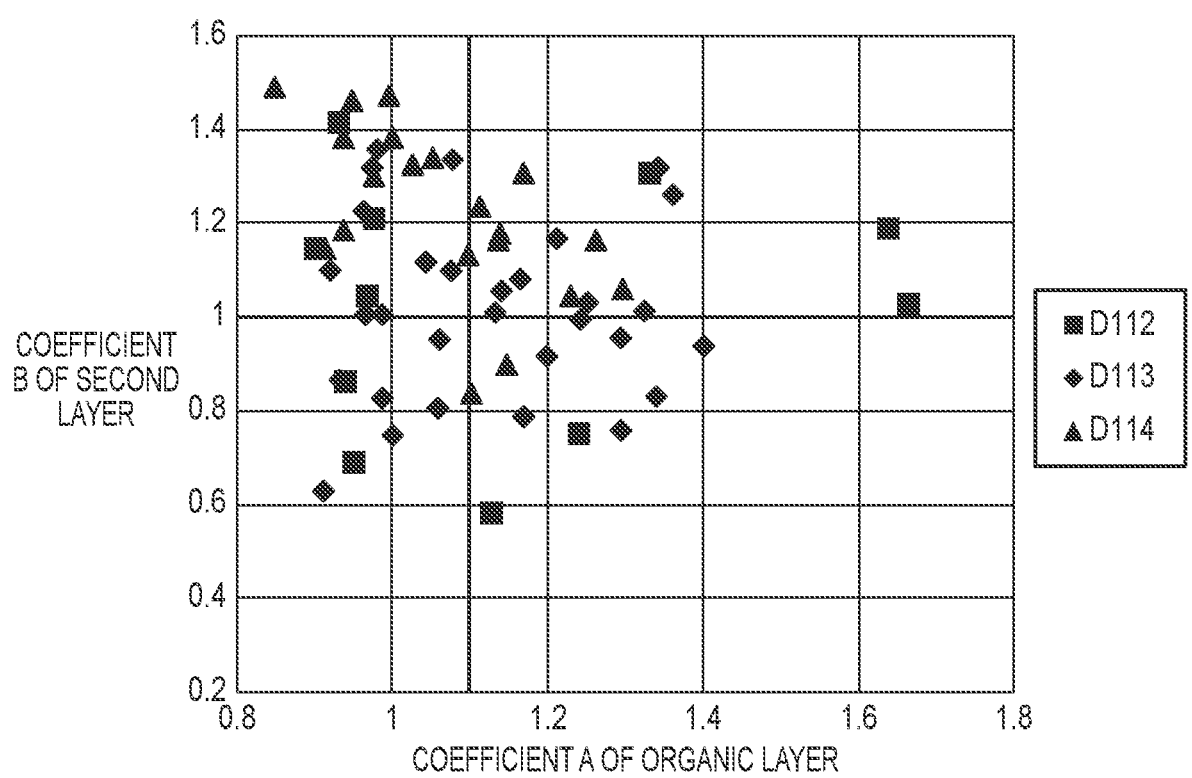
FIG. 8 is a graph showing the relationship between the coefficient A of the organic layer and the coefficient B of a second layer of each organic device according to FIG. 1.

FIG. 8 shows the relationship between the coefficient A of the organic layer 30 according to each Pareto optimal solution of FIG. 6 and the coefficient B of the second layer 52 obtained from equation (4). Regarding second layer 52, the correlation with respect to the coefficient A has a smaller influence than the first layer 51, and, for example, the coefficient B of the second layer 52 may be set to be 0.6 (inclusive) to 1.4 (inclusive). That is, the film thickness of the second layer 52 may be set to be smaller than the λb/4 optical condition or may be set to be larger than the λb/4 optical condition. The refractive index of each material described above which may be used for the second layer 52 is about 1.3 to 1.5. Hence, based on the relationship between the coefficient B and the refractive index, the film thickness of the second layer 52 can be set to, for example, fall within the range of 10 nm (inclusive) to 300 nm (inclusive) as shown in FIG. 18.

Figure 9:
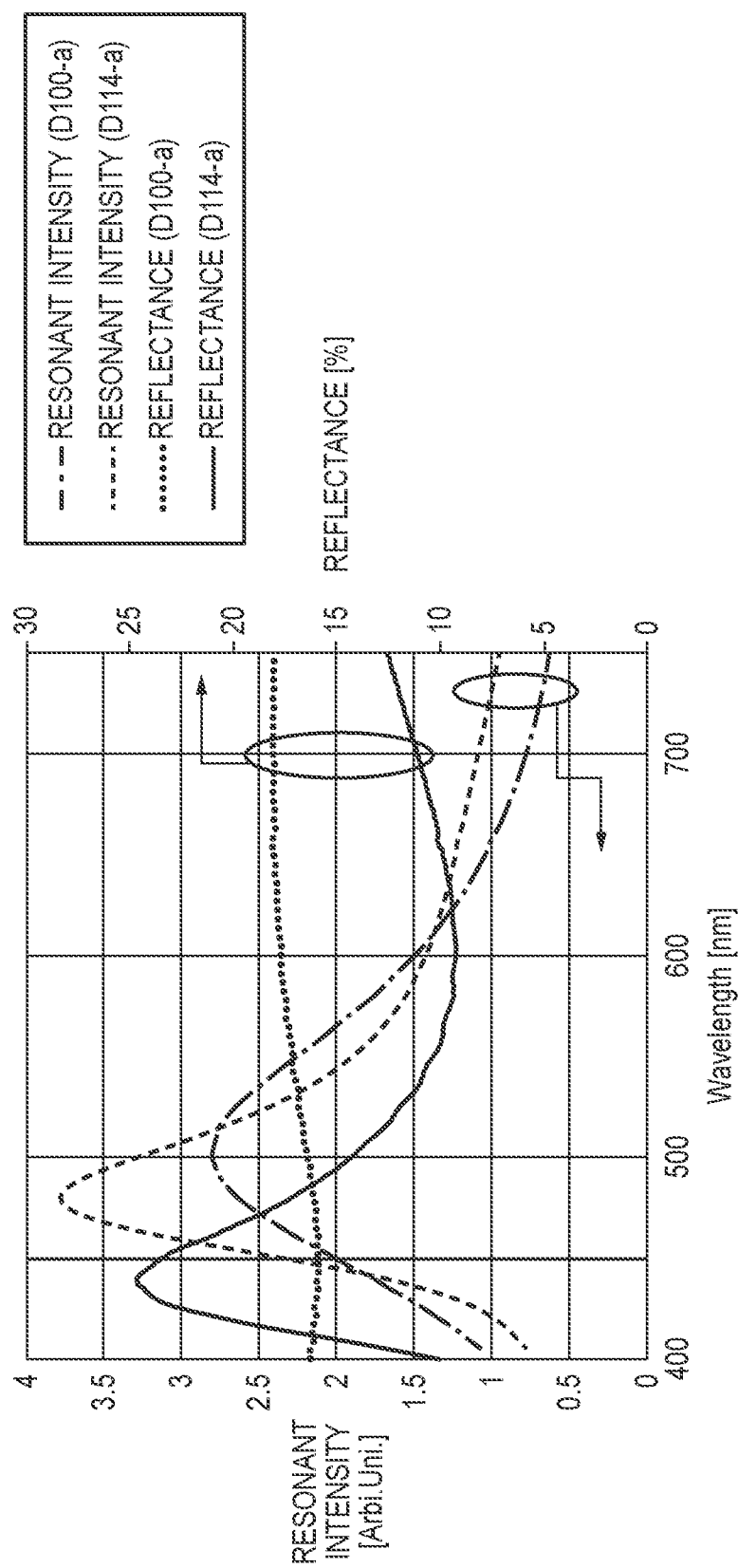
FIG. 9 is a graph showing the wavelength dependence of reflectances and resonant intensities of the organic devices according to the comparative example.
Figure 10:
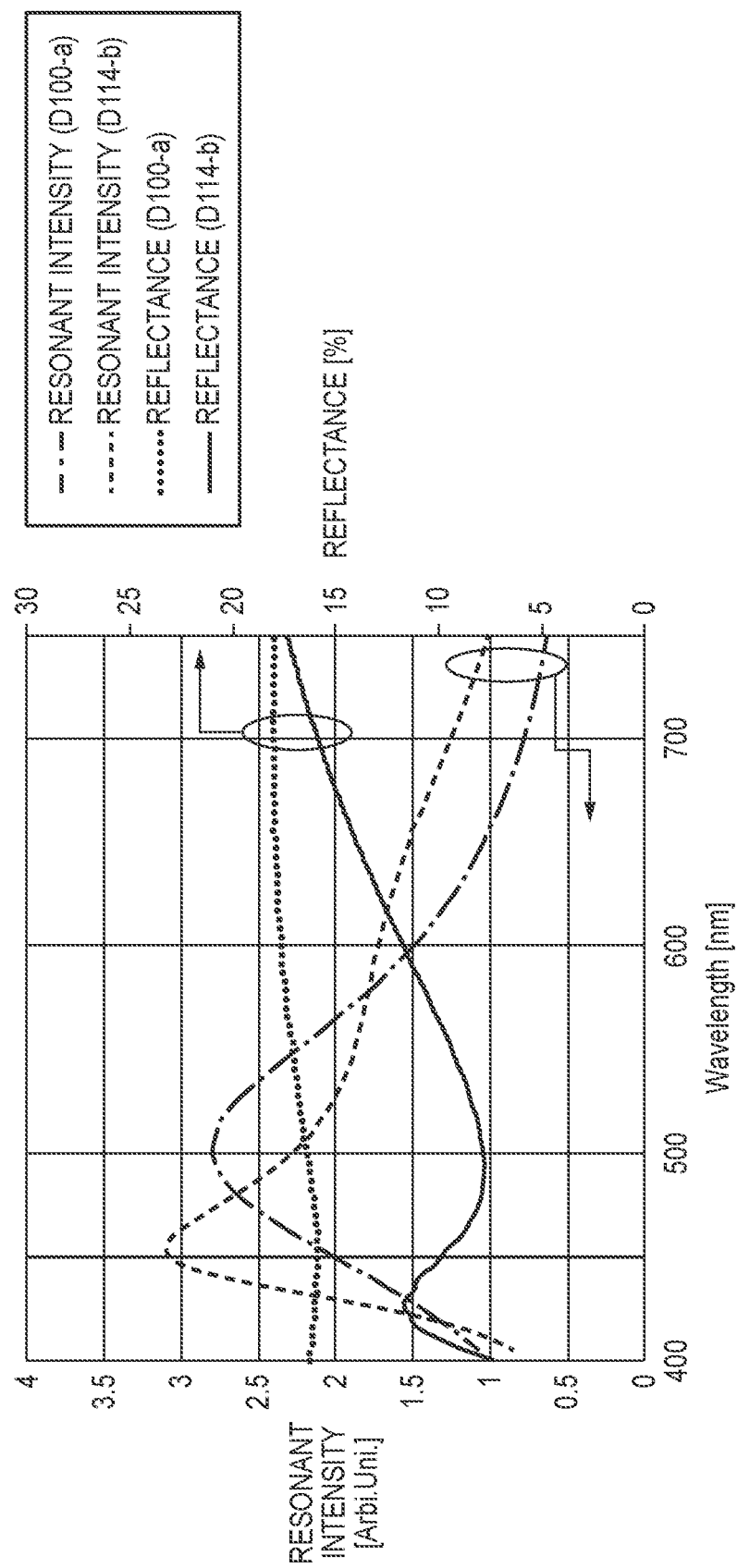
FIG. 10 is a graph showing the wavelength dependence of reflectances and resonant intensities of the organic device of the organic device of FIG. 1 and that of the organic device of the comparative example.

FIGS. 9 and 10 are graphs illustrating the wavelength dependency of the resonant intensity of each light emitting element 10 according to the embodiment. FIG. 9 shows the calculation results of the wavelength dependency of the resonant intensity of an element D100-a which does not include the first layer 51 and the second layer 52, and that of an element D114-a in which the coefficient B of each of the first layer 51 and the second layer 52 is 1 according to a comparative example. Also, FIG. 9 shows the calculation result of the wavelength dependency of reflectance of light, which is emitted from the light emitting layer 32 of the organic layer 30 and is obtained closer to the side of the interference adjustment layer 50 than the organic layer 30, of the element D100-a and that of the element D114-a. FIG. 10 shows the wavelength dependency of the resonant intensity of the element D100-a according to the comparative example and an element D114-b in which the coefficient B of the first layer 51 is 0.64 according to an example of the embodiment. FIG. 10 also shows the calculation result of the wavelength dependency of reflectance of light, which is emitted from the light emitting layer 32 of the organic layer 30 and is obtained closer to the side of the interference adjustment layer 50 than the organic layer 30, of the element D100-a and that of the element D114-b. FIG. 21 is a table summarizing the coefficient A of the organic layer 30, the coefficient B of the first layer 51, and the coefficient B of the second layer 52 of each of the elements D100-a, D114-a, and D114-d.

The film thicknesses of the hole injection transport layer 31, the electron injection transport layer 33, and the semi-transmissive electrode 40 of the light emitting element 10 have been calculated to be 20 nm, 54 nm, and 10 nm, respectively. In this case, the coefficient A of the organic layer 30 will be 1.26. Also, the refractive indices at the wavelength λb=450 nm of the first layer 51, the second layer 52, and the third layer 53 are set to 2.2, 1.56, and 1.99, respectively. The coefficient B of the first layer 51 of the element D114-a and that of the element D114-b are 1.00 and 0.64, respectively, as described above. First, in the element D100-a without the first layer 51 and the second layer 52, since an optical interference condition that strengthens the light of the green region was set because the coefficient A of the organic layer 30 is 1.26, the chromaticity v' of the B pixel was 0.205. The chromaticity v' of the B pixel of the element D114-a according to the comparative example in which the coefficient B of the first layer 51 is 1.0 was 0.188. On the other hand, the chromaticity v' of the B pixel of the element D114-b according to the example of the embodiment was 0.160. As described above, it has been found that, in an light emitting element in which the value of the coefficient A of the organic layer 30 is large, the chromaticity v' of the B pixel can be improved by reducing the coefficient B of the first layer 51.

As shown in FIG. 9, in the element D100-a, the wavelength of the resonant intensity between the reflective electrode 20 and the semi-transmissive electrode 40 increases as the coefficient A of the organic layer 30 increases (the film thickness increases), and becomes an optical interference that strengthens the light of a wavelength of about 500 nm at A=1.26. Also, since the coefficient A of the organic layer 30 is 1.26 in the element D114-a, it can be seen that the resonant intensity between the reflective electrode 20 and the semi-transmissive electrode 40 has a resonant wavelength near the wavelength of 500 nm in a similar manner. FIG. 9 further shows the reflectance of the light, which is emitted from the light emitting layer 32 of the organic layer 30 and is obtained closer to the side of the interference adjustment layer 50 than the organic layer 30, of the element D100-a and that of the element D114-a. Wavelength dependency cannot be seen in the reflectance of the element D100-a without the first layer 51 and the second layer 52. On the other hand, in the case of the element D114-a in which the coefficient B of the first layer 51 is 1.00, the reflectance of the blue region improves because the peak wavelength of the reflectance becomes 442 nm by receiving the influence from the multiple interferences of the interference adjustment layer 50. That is, by arranging the interference adjustment layer 50 on the organic layer 30, the resonant wavelength of the reflectance of light, which is emitted from the light emitting layer 32 of the organic layer 30 and is obtained closer to the side of the interference adjustment layer 50 than the organic layer 30, will be 442 nm. Although this will increase the resonant intensity of the blue region of the element D114-a and the peak wavelength of emitted light will decrease to 480 nm, it will not reach 450 nm. Hence, as shown in FIG. 21, the chromaticity of the B pixel will be (u', v')=(0.150, 0.188), and the effect of chromaticity improvement of the B pixel by the interference adjustment layer 50 is small.

On the other hand, the interference condition of the element D114-b according to the example of the embodiment is shown in FIG. 10. The coefficient B of the first layer 51 is 0.64, and the resonant wavelength of the optical distance between the reflection surface 54 and the semi-transmissive electrode 40 has a resonance closer to the short wavelength side than the shortest wavelength λb=450 of the emitted light of BD. Thus, the peak wavelength of the reflectance of light, which is emitted from the light emitting layer 32 of the organic layer 30 and is obtained closer to the side of the interference adjustment layer 50 than the organic layer 30, will be 425 nm or less, and the minimum value of the reflectance will fall in a range from 470 nm to 500 nm. Hence, the resonant wavelength of the whole element D114-b can be reduced to 450 nm from the resonant wavelength of 500 nm of the element D100-a which does not include the interference adjustment layer 50. Also, since the minimum value of the optical interference is present in the range from 480 nm to 500 nm, it can be seen that bandwidth of the resonant intensity of the whole element will narrow in the blue region. As a result, as shown in FIG. 21, the chromaticity of the B pixel of the element D114-b becomes (u', v')=0.165, 0.160), and the chromaticity of the B pixel is improved. As a result of consideration by the inventors, it has been found that the chromaticity of the B pixel will improve when the resonant wavelength of the optical distance between the semi-transmissive electrode 40 and the reflection surface 54, which is the interface between the first layer 51 and the second layer 52 of the interference adjustment layer 50 formed on the organic layer 30, becomes shorter than the wavelength λb. More specifically, it has been found that the above-described effect is enhanced when the resonant wavelength of the organic layer 30 is 510 nm (inclusive) to 550 nm (inclusive), the resonant wavelength of the optical distance between the organic layer 30 and the reflection surface 54 is 435 nm or less, and the minimum value of the optical interference of the optical distance between the organic layer 30 to the reflection surface 54 is 480 nm (inclusive) to 510 nm (inclusive).

As disclosed in Japanese Patent Laid-Open No. 2011-210677, in a case in which the film thicknesses of the first layer 51 and the second layer 52 are set as $(2m-1)\lambda b/4$ (m=0, 1, ... ), the chromaticity of the B pixel is reduced in an element in which the value of the coefficient A of the organic layer 30 is large in the manner of the element D114-a. On the other hand, in the embodiment, by reducing the coefficient B of the first layer 51, for example, by setting B<0.8 or less, it becomes possible to maintain the chromaticity of the B pixel even in each light emitting element 10 whose coefficient A of the organic layer 30 is large.

Figure 11:
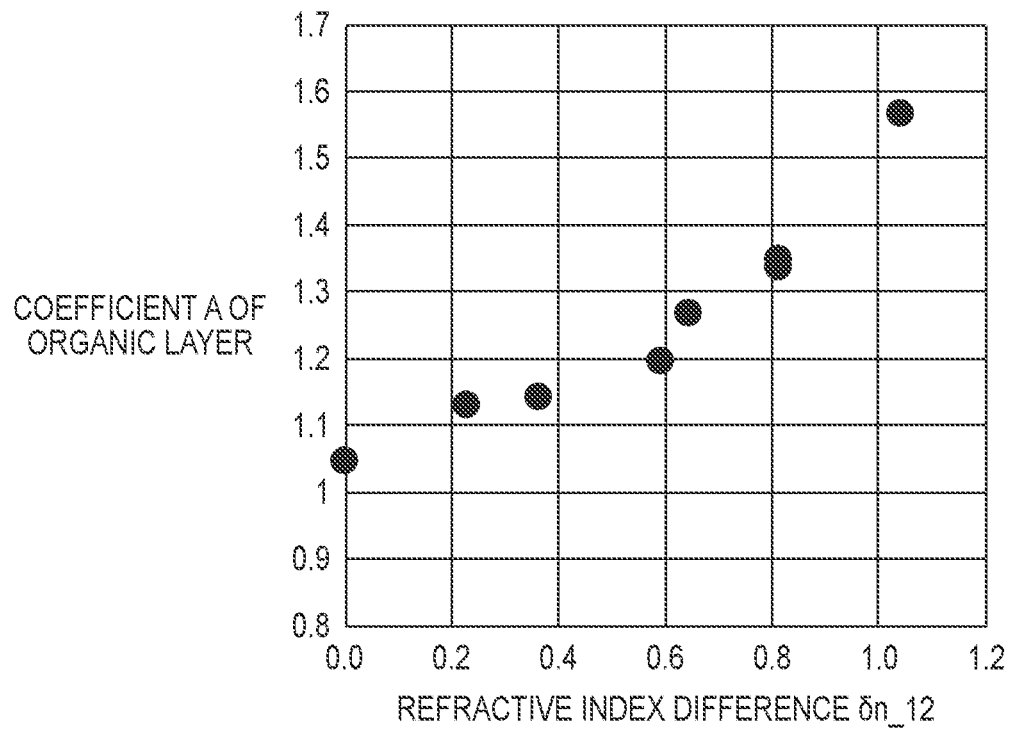
FIG. 11 is a graph showing the relationship between the coefficient A of the organic layer and a refractive index difference between the first layer and the second layer of the organic device of FIG. 1.

The refractive index of each layer of the interference adjustment layer 50 according to the first embodiment will be described next. FIG. 11 is a graph showing the relationship between a refractive index difference $\delta n_{12}$ and the coefficient A of the organic layer 30. In this case, the refractive index difference $\delta n_{12}$ is a difference ($\delta n_{12}=n_1-n_2$) between the refractive index $n_1$ of the first layer 51 at the wavelength λb=450 nm and the refractive index $n_2$ of the second layer 52 at the same wavelength λb=450 nm. The value of the coefficient A of the organic layer 30 shown in FIG. 11 is a value of the light emitting element 10 in which the chromaticity v' of the B pixel becomes 0.160 obtained from the Pareto optimal solution. That is, it is the maximum value of the coefficient A of the organic layer 30 of the light emitting element 10 that can satisfy a state in which the chromaticity v' of the B pixel is 0.160.

In FIG. 11, in contrast to a state in which the refractive index difference $\delta n_{12}$ is 0 (that is, a condition in which the first layer 51 and the second layer 52 are not arranged) and is near a state in which the coefficient A of the organic layer 30 is 1, it can be seen that the value of the coefficient A tends to increase as the refractive index difference $\delta n_{12}$ increases. In particular, the refractive index $\delta n_{12}$ has an inflection point near 0.6, and the tilt increases in a region in which $\delta n_{12}$=0.6 or more. That is, this represents that the effect of the introduction of interference adjustment layer 50 is more effective. As a result of consideration by the inventors, it has been found that setting $\delta n_{12}$>0.2 is sufficient as long as the coefficient B of the first layer 51<0.9. In addition, it has been found that the effect of the introduction of the interference adjustment layer 50 with the multilayer structure can be further obtained by setting $\delta n_{12} \geq 0.58$. Also, regarding the third layer 53, the refractive index $n_3$ of the wavelength λb of the third layer 53 can be higher than the refractive index $n_2$ of the wavelength λb of the second layer 52 as described above.

Figure 12:
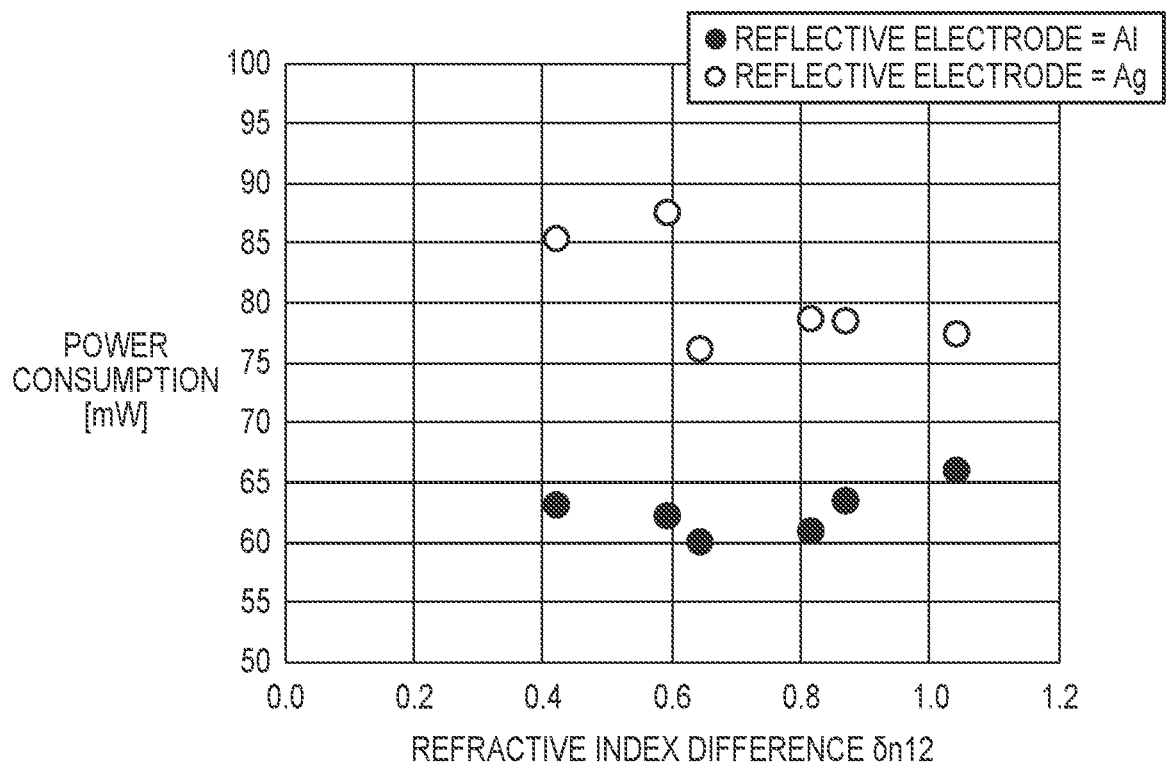
FIG. 12 is a graph showing the relationship between power consumption and the refractive index difference between the first layer and the second layer of the organic device of FIG. 1.

The reflective electrode 20 according to the first embodiment will be described next. FIG. 12 shows the relationship between power consumption and the refractive index difference $δn_{12}$ between the first layer 51 and the second layer 52 in the Pareto optimal solution arrangement having the element arrangement of the light emitting element 10 shown in FIG. 11. In this case, multi-objective optimization is performed using an objective function having two conditions of minimizing the power consumption and maximizing the coefficient A of the organic layer 30. As the constraint functions, the chromaticity of the R pixel is set to u'>0.45, the chromaticity of the G pixel is set to u'<0.13, and the chromaticity of the B pixel is set to 0.155≤v'≤0.165. Each plot of FIG. 11 represents the power consumption in the element arrangement in which the chromaticity v' of the B pixel is 0.160. That is, it is an element arrangement in which the weighting of terms such as the coefficient A of the organic layer 30 is maximum and the power consumption is minimum is set to be 1:1. Each solid plot of FIG. 12 represents a case in which the reflective electrode 20 is an Al electrode, and each hollow plot represents a case in which the reflective electrode 20 is an Ag electrode.

From FIG. 12, it can be seen that, in a case in which the reflective electrode 20 is an Ag electrode, the power consumption is about 80 mW even in the light emitting element 10 with the high refractive index $n_1$ of the first layer 51, and that the power consumption is higher than the case in which the reflective electrode 20 is an Al electrode. This increase in the power consumption is caused by the surface plasmon loss due to the Ag electrode used as the reflective electrode 20. More specifically, this is because there is a large number wave difference between the surface plasmon of the Ag electrode used as the reflective electrode 20 and the surface plasmon generated by the semi-transmissive electrode 40, and the electric field generated by the surface plasmon on the light emitting layer 32 is increased. Hence, it can be said that an Al electrode which has a high plasmon frequency is more suitable to be used as the reflective electrode 20.

The analysis result of the second embodiment will be described next. First, the effect of the introduction of the first layer 51 and the second layer 52 will be described. Other than the fact that a simulation was performed by using a dielectric as the first layer 51 and a metal (Ag) as the second layer 52, the same calculation as the method described in the first embodiment was performed in this analysis.

Figure 13:
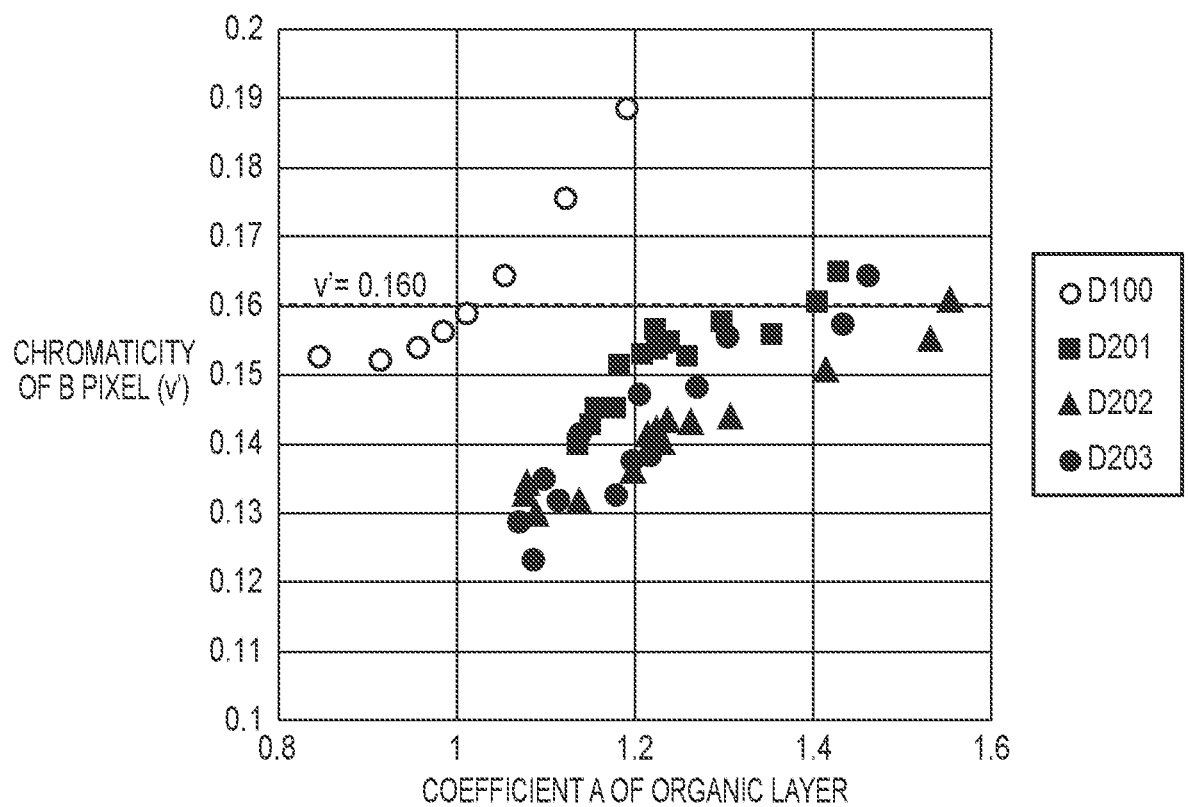
FIG. 13 is a graph showing the relationship between a coefficient A of an organic layer and a chromaticity v' of a B pixel of each organic device according to FIG. 1 and that of an organic device according to a comparative example.

FIG. 13 shows each Pareto optimal solution of the coefficient A of the organic layer 30 and a chromaticity v' of a B pixel according to the second embodiment. In this case, to clarify the relationship between the coefficient A of the organic layer 30 and the chromaticity v' of the B pixel in relation to the film thickness of the first layer 51, a calculation was performed by fixing exciton generation ratios $γ_b$, $γ_g$, and $γ_r$ of BD, GD, and RD to 0.48, 0.28, and 0.24, respectively. FIG. 13 shows an above-described element D100 without the first layer 51 and the second layer 52 according to the comparative example and elements D201, D202, and D203 according to examples of the second embodiment. There are shown Pareto solutions of a case in which the refractive indices of the first layers 51 of the elements D201, D202, and D203 are 1.40, 1.99, and 2.40, respectively. As can be understood from FIG. 13, when a comparison is performed by setting the chromaticity v' of the B pixel to 0.16, the coefficient A of the organic layer 30 will be 1 in the element D100 according to the comparative example. In contrast, the coefficient A of the organic layer 30 is A≥1.4 in the elements D201, D202, and D203 according to the examples of the second embodiment, and it can be seen that the effect of insertion of an interference adjustment layer 50 with the multilayer structure is high. Based on the relationship between the coefficient A and the refractive index of the organic layer 30, the film thickness of the organic layer 30 can be, for example, 85 nm or more or 90 nm or more. In addition, the film thickness of the organic layer 30 may be 100 nm or more. The yield when each light emitting element 10 is manufactured can be improved by increasing the film thickness of the organic layer 30.

Figure 14:
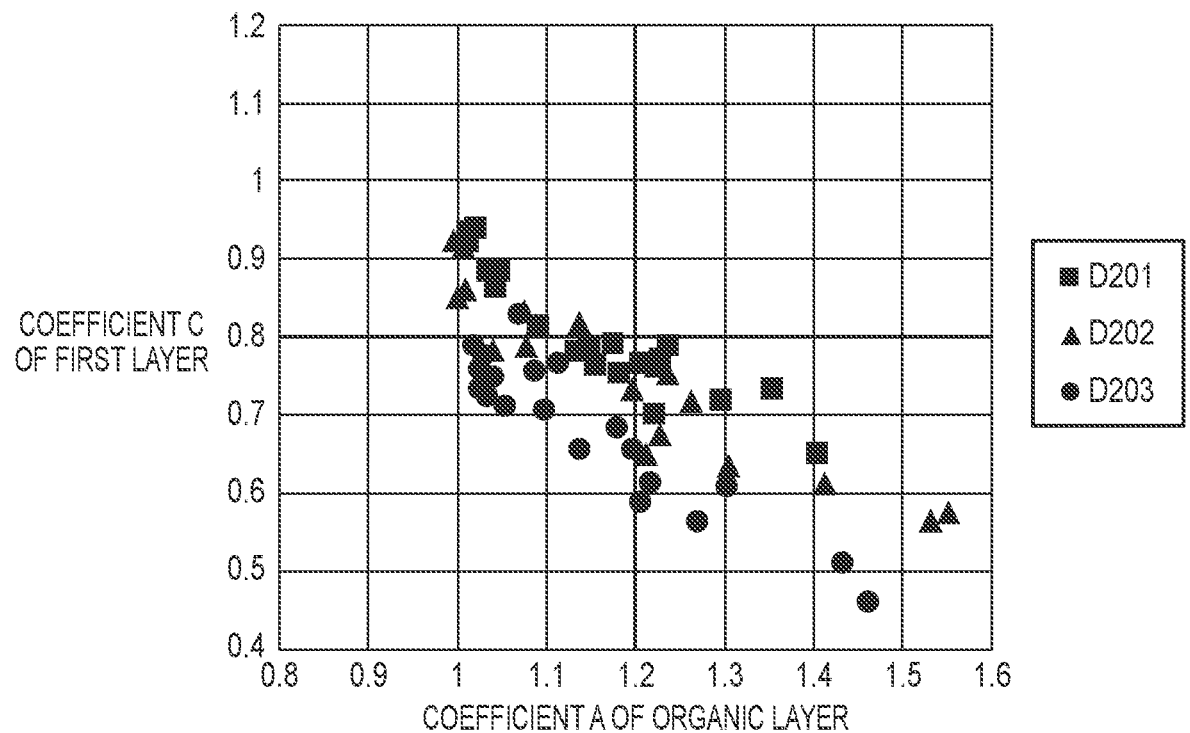
FIG. 14 is a graph showing the relationship between the coefficient A of the organic layer and a coefficient C of a first layer of each organic device according to FIG. 1.

FIG. 14 shows the coefficient C of the first layer 51 obtained from equation (6) in the Pareto optimal solution arrangement of FIG. 13. It can be seen from FIG. 12 that the value of the coefficient C decreases as the coefficient A of the organic layer 30 increases. That is, it has been found that, in a case in which the film thickness of the organic layer 30 becomes thicker than the λb/4 interference condition, it is preferable to set the film thickness of the first layer 51 so that the film thickness of the first layer 51 will be smaller than the λb/2 optical condition. In this embodiment, from the point of view of the yield, the coefficient C of the first layer 51 may be set to 0.8 or less in a case in which the coefficient A of the organic layer 30 is set to 1.2 or more. In addition, the coefficient C of the first layer 51 may be set to 0.75 or less in a case in which the coefficient A of the organic layer 30 is set to 1.3 or more. Based on the relationship between the coefficient C and the refractive index of the material to be used as the first layer 51 described above, the film thickness of the first layer 51 may be 110 nm or less. The film thickness of the first layer 51 may also be 90 nm or less. Furthermore, the film thickness of the first layer 51 may be 70 nm or less. In addition, the film thickness of the Ag layer forming the second layer 52 suffices to be 10 nm or more, and may fall within a range of 10 nm (inclusive) to 16 nm (inclusive) from the point of view of the color reproduction range of the light emitting element 10. Also, as shown in FIG. 18, the film thickness of the second layer may fall within the range of 8 nm (inclusive) to 17 nm (inclusive), and may be appropriately determined within this range.

Figure 15:
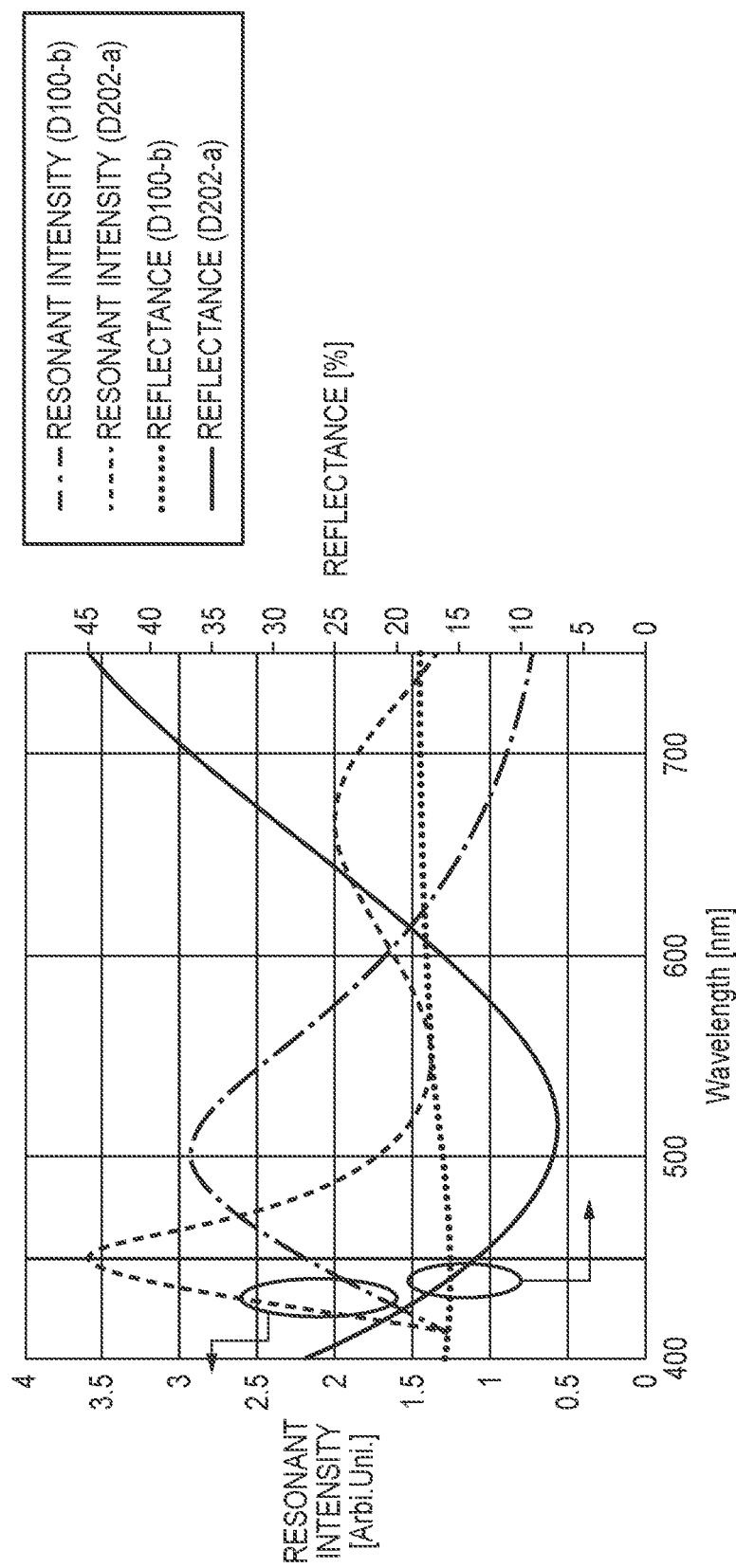
FIG. 15 is a graph showing the wavelength dependence of reflectances and resonant intensities of the organic device according to FIG. 1 and that of the organic device according to the comparative example.

The effects of the second embodiment will be described next. FIG. 15 shows the wavelength dependency of the resonant intensity of an element D100-a according to a comparative example and that of an element D202-a according to an example of the second embodiment shown in FIG. 22. In FIGS. 15 and 22, a calculation was performed by setting the film thicknesses of a hole injection transport layer 31, an electron injection transport layer 33, and the semi-transmissive electrode 40 of the light emitting element 10 as 25 nm, 54 nm, and 10 nm, respectively. In this case, the coefficient A of the organic layer 30 will be 1.31. The refractive index $n_1$ of the first layer 51 of the element D202-a is 1.98 when wavelength λb=450 nm, and the coefficient C of the first layer 51 is 0.67. In this case, as shown in FIG. 22, the chromaticity of the B pixel is (u', v')=(0.163, 0.162), and it can be said that the effect of the introduction of the interference adjustment layer 50 which has the multilayer structure including the first layer 51 and the second layer 52 is being exhibited.

In a case in which the coefficient A of the organic layer 30 is 1, the resonant intensity between the reflective electrode 20 and the semi-transmissive electrode 40 will have a peak intensity with respect to a light of the wavelength of 450 nm. However, as the coefficient A increases, the peak wavelength of the resonant intensity will increase, and this will strengthen light of a wavelength of about 512 nm when the coefficient A is 1.31. A solid line shown in FIG. 15 represents the reflectance of light, which is emitted from the light emitting surface of BD of a light emitting layer 32 of the organic layer 30, obtained on the side closer to the interference adjustment layer 50 than the organic layer 30. In a case in which the coefficient C of the first layer 51 is 1, the peak of the reflectance is generated near 450 nm. As shown in FIG. 15, in a case in which the coefficient C of the first layer 51 is 0.67, the peak wavelength of light reflected by the semi-transmissive electrode 40 will shift to the short wavelength side and will be 400 nm or less. As a result, the resonant frequency, in the case in which the first layer 51 and the second layer 52 are arranged according to this embodiment, will shift greatly to the short wavelength side, and the peak wavelength will be 450 nm. Also, in the same manner as the case according to the first embodiment shown in FIG. 10, the minimum value of the reflectance will be near 500 nm. Hence, the bandwidth of the resonant frequency of the element D202-a narrows in the blue region. As a result, even in a case in which the film thickness of the organic layer 30 has increased, the chromaticity v' of the B pixel can be maintained. That is, both the improvement in the reliability and the color reproducibility of the organic device 100 can also be implemented in the second embodiment.

Figure 16:
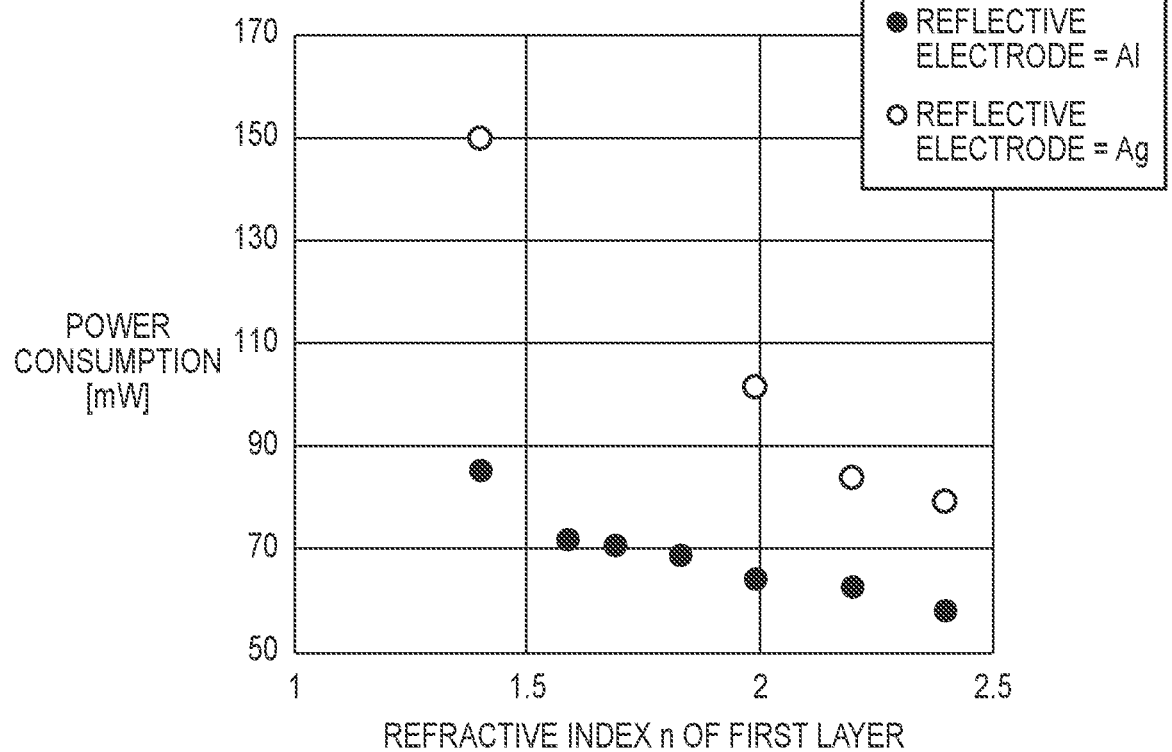
FIG. 16 is a graph showing the relationship between power consumption and a refractive index of the first layer of each organic device according to FIG. 1.

In the second embodiment, if the first layer 51 satisfies the coefficient C described above, the dependency of the refractive index of the first layer 51 with respect to the coefficient A of the organic layer 30 will be low. However, in the second embodiment, due to the fact that the second layer 52 is a metal, the dependency of the refractive index of the first layer 51 will be exhibited with respect to the power consumption. An arrangement for further improving the characteristics of the second embodiment from the dependency of the refractive index of the first layer 51 shown in FIG. 16 will be described. FIG. 16 shows the relationship between the power consumption and the refractive index $n_1$ of the first layer 51 in the Pareto optimal solution arrangement obtained in the range of FIG. 22. In this case, the multi-objective optimization is performed by using the objective function having the two conditions of minimizing the power consumption and maximizing the coefficient A of the organic layer 30. As the constraint functions, the chromaticity of the R pixel is set to u'>0.45, the chromaticity of the G pixel is set to u'<0.13, and the chromaticity of the B pixel is set to $0.155 \leq v' \leq 0.165$. Each plot of FIG. 16 represents the power consumption in the element arrangement in which the chromaticity v' of the B pixel is 0.160. That is, it is an element arrangement in which the weighting of terms such as the coefficient A of the organic layer 30 is maximum and the power consumption is minimum is set to be 1:1. Each solid plot in FIG. 16 represents a case in which the reflective electrode 20 is an Al electrode (Al/Ti stacked electrode), and each hollow plot represents a case in which the reflective electrode is an Ag electrode.

It can be seen that, in a case in which the reflective electrode 20 is an Ag electrode, the power consumption is about 80 mW even if the high refractive index $n_1$ of the first layer 51 is set to 2.44, and that the power consumption is higher than the case in which the reflective electrode 20 is an Al electrode. This increase in the power consumption is caused by the surface plasmon loss due to the Ag electrode used as the reflective electrode 20. More specifically, this is because there is a large number wave difference between the surface plasmon of the Ag electrode used as the reflective electrode 20 and the surface plasmon generated by the semi-transmissive electrode 40 and the second layer 52, and the electric field generated by the surface plasmon on the light emitting layer 32 is increased. Hence, it can be said that an Al electrode which has a high plasmon frequency is more suitable to be used as the reflective electrode 20.

A case in which an Al electrode is used as the reflective electrode 20 will be described next. In a case in which the Al electrode is used as the reflective electrode 20, the power consumption will be lower than the power consumption of the case in which the Ag electrode is used as the reflective electrode 20. Examining the dependency of the refractive index $n_1$ of the first layer 51 in the light emitting element 10 using the Al electrode as the reflective electrode 20, it can be seen that the power consumption tends to increase as the refractive index $n_1$ decreases in the manner of 58 mW, 64 mW, and 72 mW when the refractive index $n_1$ of the first layer 51 is 2.44, 2.00, and 1.60, respectively. Furthermore, the power consumption increase ratio will change at the refractive index of 1.40, and the power consumption will be 86 mW when the refractive index $n_1$ of the first layer 51 is 1.40. That is, it can be seen from FIG. 16 that the power consumption has an inflection point in a region where the refractive index $n_1$ of the first layer 51 is near 1.6.

Figure 17:
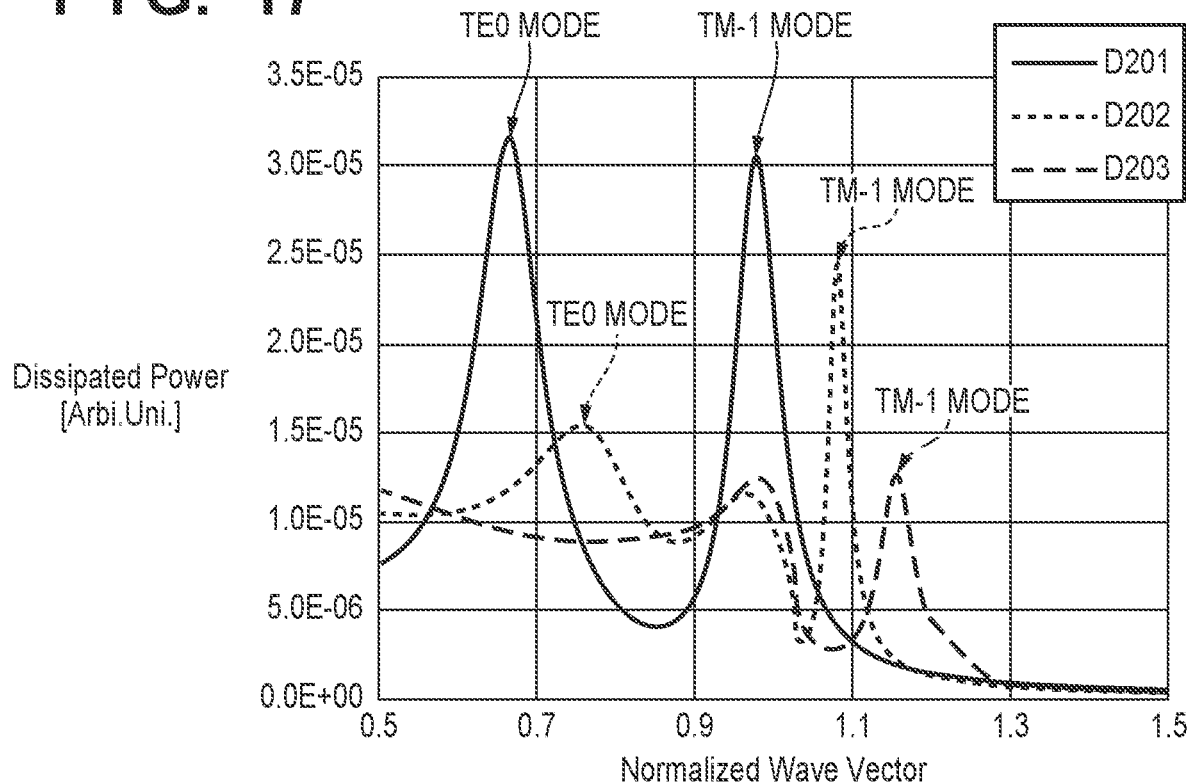
FIG. 17 is a graph showing exciton dissipation energy expressing surface plasmon loss in each organic device according to FIG. 1.

FIG. 17 shows the energy dissipation spectrum of the elements D201, D202, and D203 in a case in which the Al electrode (Al/Ti stacked electrode) is the reflective electrode 20 of FIG. 16. The refractive indices $n_1$ of the first layers 51 of the elements D201, D202, and D203 are 1.40, 1.99, and 2.40, respectively, and each film thickness arrangement was calculated to be a film thickness arrangement in which the chromaticity v' of the B pixel will be 0.160. The abscissa is a normalized wavenumber and has been normalized by the wavenumber of the light emitting layer 32, and a region which is 1 or more represents a surface plasmon loss.

FIG. 17 shows a surface plasmon mode referred to as TM-1 modes of the elements D201, D202, and D203. It is a mode obtained by antisymmetric bonding of a long-range surface plasmon (LRSP) generated in each of the semi-transmissive electrode 40 and the second layer 52 and the surface plasmon generated by the Al electrode used as the reflective electrode 20. It can be seen that the increase in the power consumption of the example D201 shown in FIG. 16 is an increase in the TM-1 mode caused by the low refractive index $n_1$ of the first layer 51.

In this manner, from the point of view of TM-1 mode suppression, it is preferable for the refractive index $n_1$ of the first layer 51 to have a large value as much as possible. In addition, it can be seen that, from the result shown in FIG. 16, a material which has a refractive index of 1.6 or more and is higher than the inflection point of power consumption may be used as the first layer 51.

Furthermore, from the point of view of power consumption suppression, a material which has a refractive index of 1.9 or more may be used as the first layer 51.

Figure 23:
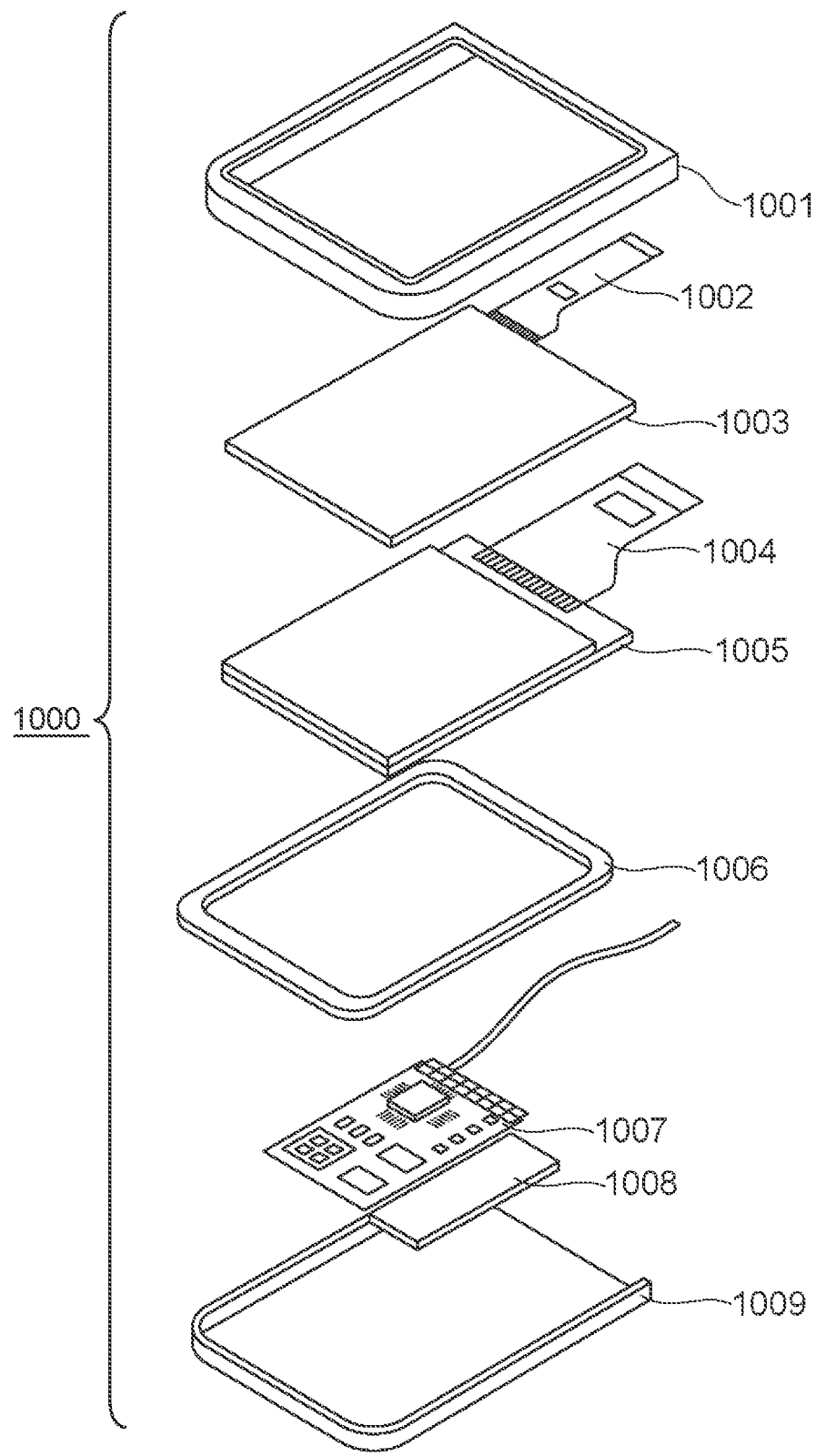
FIG. 23 is a view showing an example of a display apparatus using the organic display device according to FIG. 1.

Application examples in which the organic device 100 according to the embodiments is applied to any one of a display apparatus, an image capturing apparatus, a portable device, an illumination apparatus, and a moving body will be described hereinafter with reference to FIGS. 23 to 28. FIG. 23 is a schematic view showing an example of a display apparatus using the organic device 100 according to the embodiments. A display apparatus 1000 can include a touch panel 1003, a display panel 1005, a frame 1006, a circuit substrate 1007, and a battery 1008 between an upper portion cover 1001 and a lower portion cover 1009. Flexible print circuits FPC 1002 and 1004 are connected to the touch panel 1003 and the display panel 1005. An active element such as a transistor or the like is arranged on the circuit substrate 1007. The battery 1008 need not be arranged unless the display apparatus 1000 is a portable device, and need not be arranged in the position even if the display apparatus is a portable device. The above-described organic device 100 that functions as a light emitting apparatus by including the organic layer 30 which includes an organic light emitting material, such as organic EL, can be used as the display panel 1005. The organic device 100 that functions as the display panel 1005 operates by being connected to an active element such as a transistor or the like arranged on the circuit substrate 1007.

The display apparatus 1000 shown in FIG. 23 may be used as a display unit of an image capturing apparatus that includes an optical unit including a plurality of lenses and an image capturing element configured to receive light that passed through the optical unit. The image capturing apparatus can include a display unit for displaying information obtained by the image capturing element. The display unit can also be a display unit exposed outside the image capturing apparatus or a display unit arranged inside the viewfinder. The image capturing apparatus may be a digital camera or a digital video camera.

Figure 24:
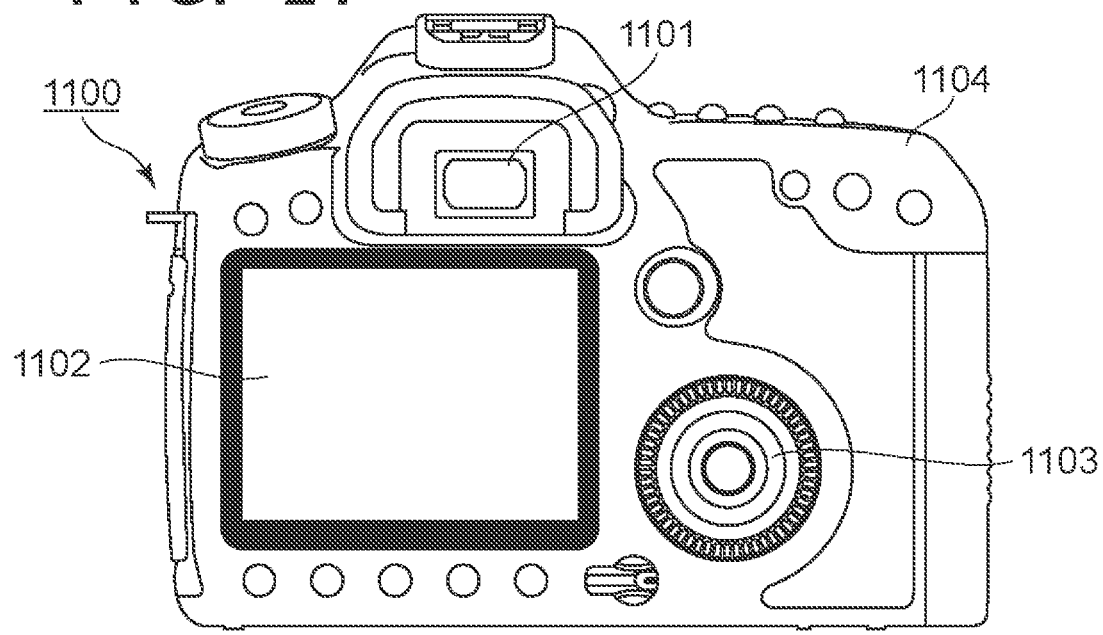
FIG. 24 is a view showing an example of an image capturing apparatus using the organic device according to FIG. 1.

FIG. 24 is a schematic view showing an example of an image capturing apparatus using the organic device 100 according to the embodiments. An image capturing apparatus 1100 can include a viewfinder 1101, a back surface display 1102, an operation unit 1103, and a housing 1104. The above-described organic device 100 that functions as a light emitting apparatus by including the organic layer 30 which includes an organic light emitting material can be used as the viewfinder 1101 which is a display unit. In this case, the organic device 100 may not only display an image to be captured, but also environment information, an image capturing instruction, and the like. The environment information may be information of the intensity of natural light, the direction of the natural light, the speed of the movement of an object, the possibility that the object is shielded by a shielding object, and the like.

Since the timing suitable for image capturing frequently tends to be a short period of time, it is preferable to display information as quickly as possible. Hence, the above-described organic device 100 including the organic layer 30 which includes an organic light emitting material can be used as the viewfinder 1101. This is because an organic light emitting material has a high response speed. The organic device 100 using an organic light emitting material can be used more suitably, than a liquid crystal display apparatus, for these apparatuses that require high display speed.

The image capturing apparatus 1100 includes an optical unit (not shown). The optical unit includes a plurality of lenses, and forms an image on an image capturing element (not shown) that receives light that passed through the optical unit and is contained in the housing 1104. The focal points of the plurality of lenses can be adjusted by adjusting their relative positions. This operation can be performed automatically.

The above-described organic device 100 that functions as a light emitting apparatus by including the organic layer 30 which includes an organic light emitting material can be used as a display unit of a portable device. In this case, the organic device may have both a display function and an operation function. The mobile device can be a mobile phone such as smartphone or the like, a tablet, a head-mounted display, or the like.

Figure 25:
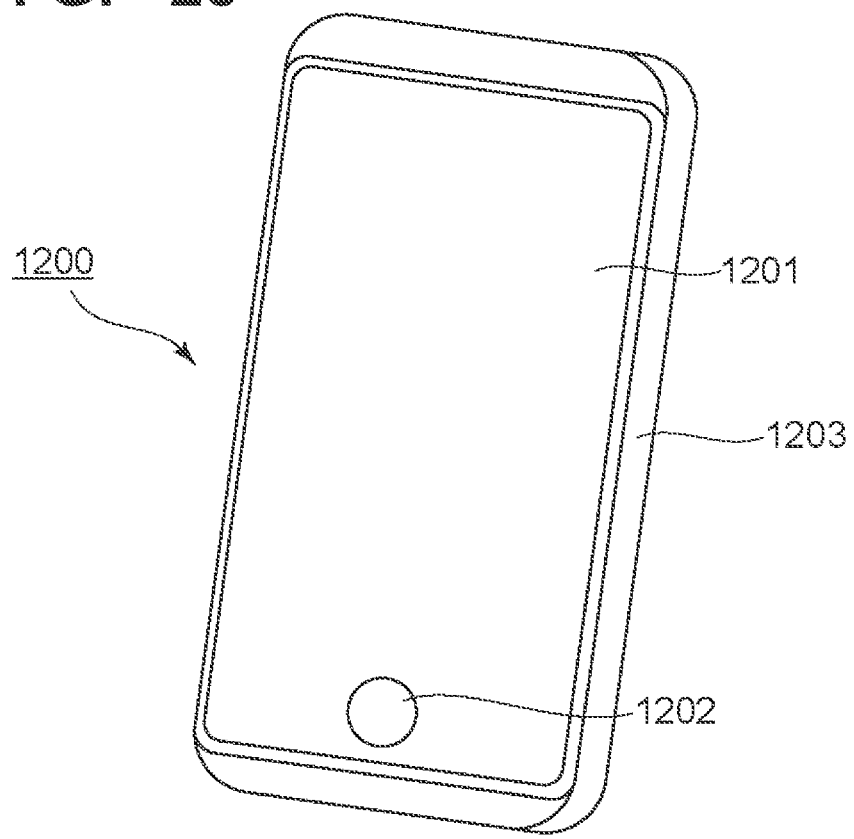
FIG. 25 is a view showing an example of a portable device using the organic device according to FIG. 1.

FIG. 25 is a schematic view showing an example of a portable device using the organic device 100 according to the embodiments. A portable device 1200 includes a display unit 1201, an operation unit 1202, and a housing 1203. The housing 1203 can include a circuit, a printed board which includes the circuit, a battery, and a communication unit. The operation unit 1202 can either be a button or a touch-panel-type reaction unit. The operation unit 1202 can also be a biometric authentication unit that performs unlocking or the like by authenticating a fingerprint. A portable device including a communication unit can also be regarded as a communication apparatus. The above-described organic device 100 that functions as a light emitting apparatus by including the organic layer 30 which includes an organic light emitting material can be used as the display unit 1201.

Figure 26A:
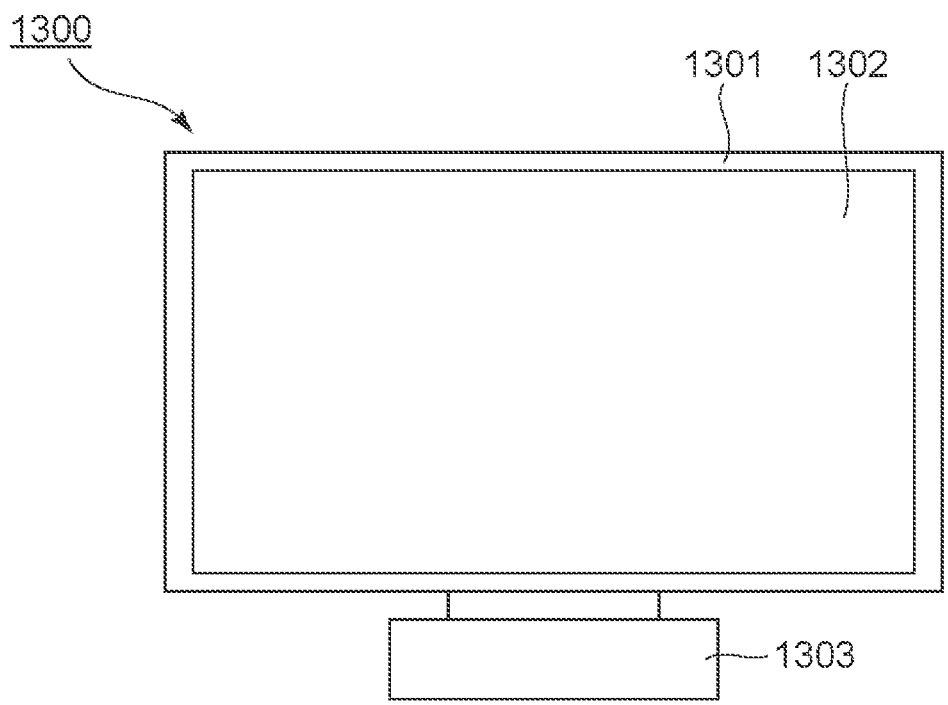
FIGS. 26A and 26B are views each showing an example of a display apparatus using the organic device according to FIG. 1.
Figure 26B:
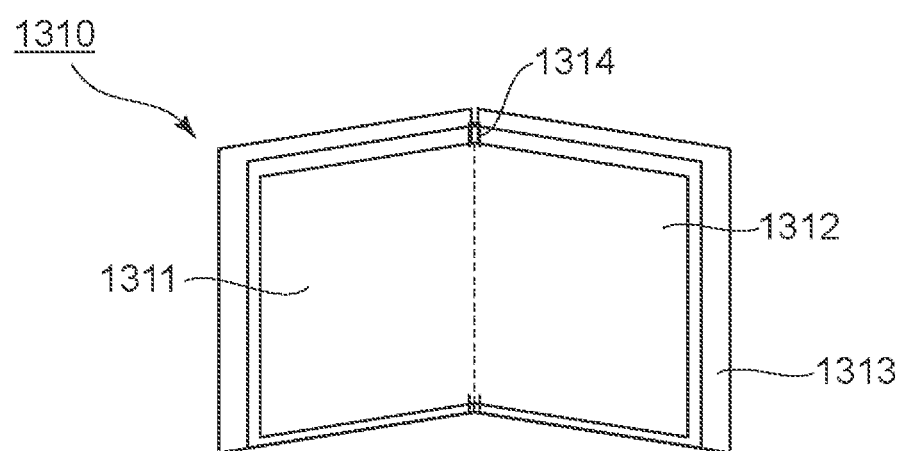

FIGS. 26A and 26B are schematic views showing examples of a display apparatus using the organic device 100 according to the embodiments. FIG. 26A shows a display apparatus such as a television monitor or a PC monitor. A display apparatus 1300 includes a frame 1301 and a display unit 1302. The above-described organic device 100 that functions as a light emitting apparatus by including the organic layer 30 which includes an organic light emitting material can be used as the display unit 1302. The display apparatus 1300 may also include a base 1303 that supports the frame 1301 and the display unit 1302. The base 1303 is not limited to the form shown in FIG. 26A. For example, the lower side of the frame 1301 may also function as the base 1303. In addition, the frame 1301 and the display unit 1302 can be bent. The radius of curvature in this case can be 5,000 mm (inclusive) to 6,000 (inclusive) mm.

FIG. 26B is a schematic view showing another example of the display apparatus using the organic device 100 according to the embodiments. A display apparatus 1310 shown in FIG. 26B can be folded, that is, the display apparatus 1310 is a so-called foldable display apparatus. The display apparatus 1310 includes a first display unit 1311, a second display unit 1312, a housing 1313, and a bending point 1314. The above-described organic device 100 that functions as a light emitting apparatus by including the organic layer 30 which includes an organic light emitting material can be used as each of the first display unit 1311 and the second display unit 1312. The first display unit 1311 and the second display unit 1312 can be one seamless display device. The first display unit 1311 and the second display unit 1312 can be divided from the bending point. The first display unit 1311 and the second display unit 1312 can display different images and can also display a single image together.

Figure 27:
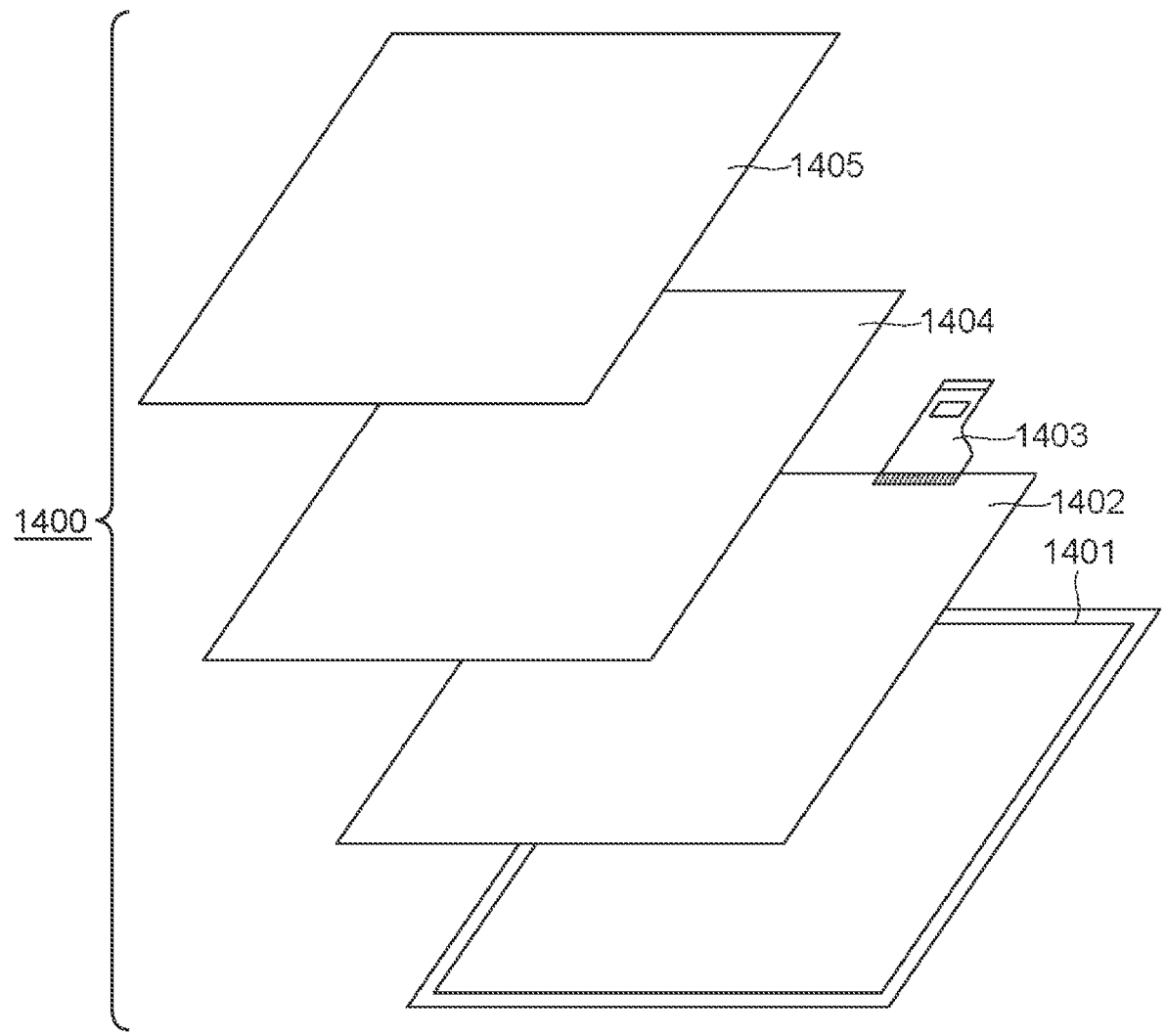
FIG. 27 is a view showing an example of an illumination apparatus using the organic device according to FIG. 1.

FIG. 27 is a schematic view showing an example of the illumination apparatus using the organic device 100 according to the embodiments. An illumination apparatus 1400 can include a housing 1401, a light source 1402, a circuit board 1403, an optical film 1404, and a light diffusing unit 1405. The above-described organic device 100 that functions as a light emitting apparatus by including the organic layer 30 which includes an organic light emitting material can be used as the light source 1402. The optical film 1404 can be a filter that improves the color rendering of the light source. The light diffusing unit 1405 can light up or the like to deliver the light of the light source over a broad range by effectively diffusing the light. The illumination apparatus 1400 can also include a cover on the outermost portion. The illumination apparatus 1400 may include both the optical film 1404 and the light diffusing unit 1405 or may include only one of these components.

The illumination apparatus 1400 is an apparatus for illuminating a room or the like. The illumination apparatus 1400 can emit white light, natural white light, or light of any color from blue to red. The illumination apparatus 1400 can also include a light control circuit for controlling these light components. The illumination apparatus 1400 can also include a power supply circuit to be connected to the organic device 100 that functions as the light source 1402. The power supply circuit can be a circuit for converting an AC voltage into a DC voltage. "White" has a color temperature of about 4,200 K, and "natural white" has a color temperature of about 5,000 K. The illumination apparatus 1400 may also have a color filter. In addition, the illumination apparatus 1400 can have a heat radiation unit. The heat radiation unit radiates the internal heat of the apparatus to the outside of the apparatus, and examples are a metal having a high specific heat and liquid silicon.

Figure 28:
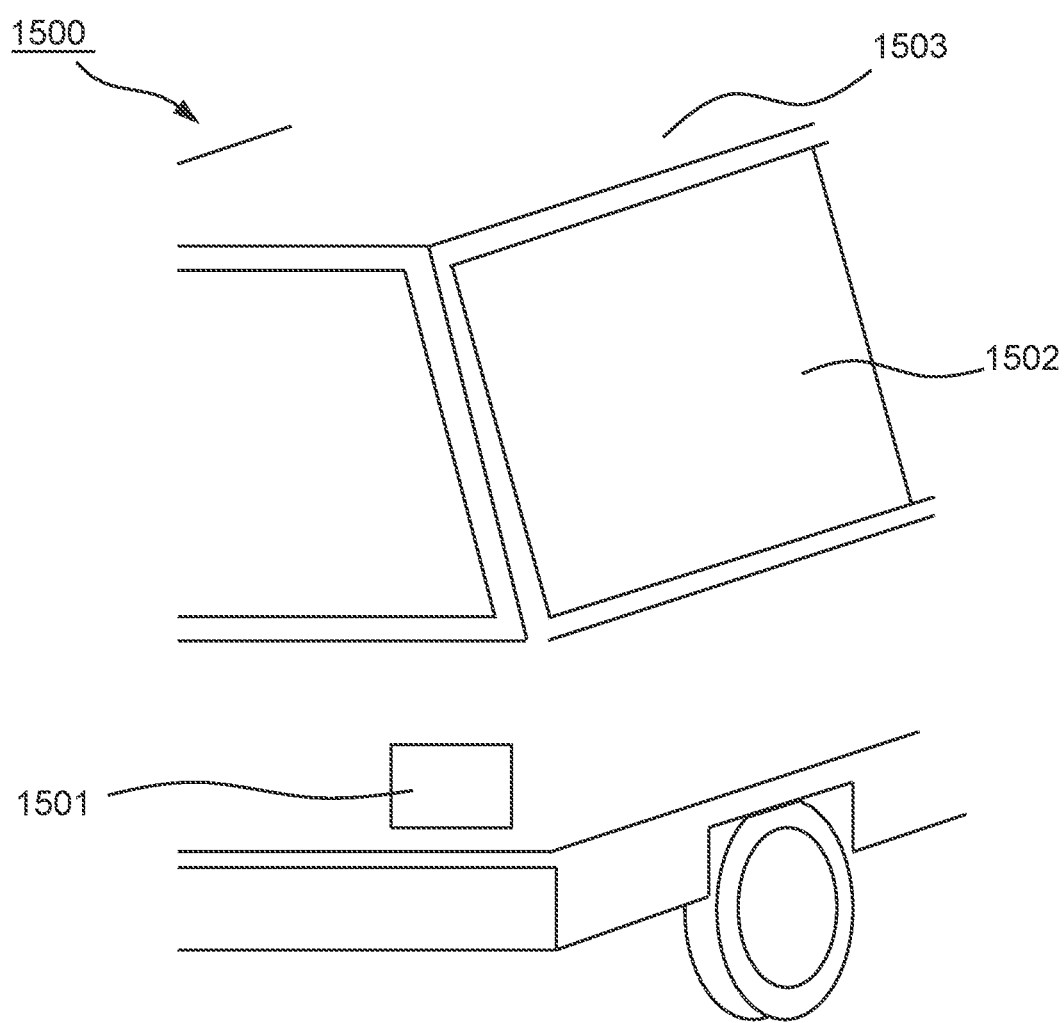
FIG. 28 is a view showing an example of an automobile using the organic device according to FIG. 1.

FIG. 28 is a schematic view of an automobile including a taillight as an example of a vehicle lighting device using the organic device 100 according to the embodiments. An automobile 1500 has a taillight 1501, and the taillight 1501 is turned on when a braking operation or the like is performed. The organic device 100 according to the embodiments may also be used as a headlight as a vehicle lighting device. The automobile is an example of a moving body, and the moving body can be a ship, a drone, an airplane, a railway vehicle or the like. The moving body can include a main body and a lighting device installed in the main body. The lighting device may also be an apparatus that notifies the current position of the main body.

The above-described organic device 100 that functions as a light emitting apparatus by including the organic layer 30 which includes an organic light emitting material can be used as the taillight 1501. The taillight 1501 can have a protection member for protecting the organic device 100 that functions as the taillight 1501. Although the material of the protection member is not limited as long as it is a transparent material with a high degree of strength to a certain extent, it may be made of polycarbonate or the like. The protection member can also be formed by mixing a furandicarboxylic acid derivative or an acrylonitrile derivative in polycarbonate.

The automobile 1500 can include a vehicle body 1503 and a window 1502 attached to the vehicle body 1503. This window can be a window for checking the front and rear of the automobile, and can also be a transparent display. The above-described organic device 100 that functions as a light emitting apparatus by including the organic layer 30 which includes an organic light emitting material can be used as this transparent display. In this case, the constituent materials such as the electrodes of the organic device 100 are formed by transparent members.

According to the present invention, a technique advantageous in improving both the reliability and the color reproducibility of an organic device can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An organic device comprising a reflective electrode configured to reflect light, an organic layer arranged on the reflective electrode, a semi-transmissive electrode arranged on the organic layer, and an interference adjustment layer arranged on the semi-transmissive electrode,
   wherein the organic layer includes a light emitting layer configured to emit blue light,
   wherein the interference adjustment layer includes a first layer in contact with the semi-transmissive electrode, a second layer arranged on the first layer, and a third layer arranged on the second layer,
   wherein the first layer is made of an element selected from the group consisting of silicon nitride, silicon oxynitride, titanium oxide, zinc sulfide, and indium tin oxide,
   wherein the second layer is made of an element selected from the group consisting of magnesium fluoride, lithium fluoride, a fluoropolymer, silver, magnesium, and combinations thereof,
   wherein the third layer is made of an element selected from the group consisting of silicon oxide, silicon nitride, silicon oxynitride, and aluminum oxide,
   wherein a film thickness of the organic layer is not less than 85 nm,
   wherein a film thickness of the first layer is not more than 50 nm,
   wherein a film thickness of the second layer is 10 nm to 300 nm,
   wherein a resonant wavelength of the organic layer is 510 nm to 550 nm,
   wherein a resonant wavelength of an optical distance between the organic layer and a reflection surface which is an interface between the first layer and the second layer is not more than 435 nm, and
   wherein a minimum value of optical interference of the optical distance between the organic layer and the reflection layer is 480 nm to 510 nm.

2. The device according to claim 1, wherein an optical distance L of the organic layer satisfies:

$$L \geq [\{(\phi r + \phi s)/\pi\} \times (\lambda b/4)] \times 1.2,$$

where $\lambda b$ [nm] is a peak wavelength of emitted light of a blue light emitting layer, $\phi r$ [rad] is a phase shift amount of the light of the wavelength $\lambda b$ in the reflective electrode, $\phi s$ [rad] is a phase shift amount of the light of the wavelength $\lambda b$ in the semi-transmissive electrode, and
   wherein a resonant wavelength of an optical distance between the semi-transmissive electrode and a reflection surface formed above the semi-transmissive electrode is shorter than the wavelength $\lambda b$.

3. The organic device according to claim 2, wherein the reflection surface is an interface between the first layer and the second layer.

4. The organic device according to claim 1, wherein a refractive index of a wavelength $\lambda b$ of the first layer is higher than a refractive index of the wavelength $\lambda b$ of the second layer,
   where $\lambda b$ [nm] is a peak wavelength of emitted light of a blue light emitting layer.

5. The organic device according to claim 1, wherein a refractive index of a wavelength $\lambda b$ of the third layer is higher than a refractive index of the wavelength $\lambda b$ of the second layer,
   where $\lambda b$ [nm] is a peak wavelength of emitted light of a blue light emitting layer.

6. The organic device according to claim 1, wherein an optical distance L of the organic layer satisfies:

$$L \geq [\{(\phi r + \phi s)/\pi\} \times (\lambda b/4)] \times 1.35, \text{ and}$$

wherein an optical distance L1 of the first layer satisfies:

$$L1 \leq (\lambda b/4) \times 0.75,$$

where $\lambda b$ [nm] is a peak wavelength of emitted light of a blue light emitting layer, $\phi r$ [rad] is a phase shift amount of the light of the wavelength $\lambda b$ in the reflective electrode, ϕs [rad] is a phase shift amount of the light of the wavelength λb in the semi-transmissive electrode.

7. The organic device according to claim 1, wherein an optical distance L1 of the first layer satisfies:

$$L1 \leq (\lambda b/2) \times 0.8,$$

where λb [nm] is a peak wavelength of emitted light of a blue light emitting layer.

8. The organic device according to claim 1, wherein an optical distance L of the organic layer satisfies:

$$L \geq [\{(\phi r + \phi s)/\pi\} \times (\lambda b/4)] \times 1.3, \text{ and}$$

wherein an optical distance L1 of the first layer satisfies:

$$L1 \leq (\lambda b/2) \times 0.7,$$

where λb [nm] is a peak wavelength of emitted light of a blue light emitting layer, ϕr [rad] is a phase shift amount of the light of the wavelength λb in the reflective electrode, ϕs [rad] is a phase shift amount of the light of the wavelength λb in the semi-transmissive electrode.

9. The organic device according to claim 1, wherein the film thickness of the organic layer is not less than 90 nm.

10. The organic device according to claim 9, wherein the film thickness of the first layer is not more than 40 nm.

11. The organic device according to claim 1, wherein a refractive index of a wavelength λb of the third layer is not less than 1.9, where λb [nm] is a peak wavelength of emitted light of a blue light emitting layer.

12. The organic device according to claim 1, wherein the reflective electrode does not contain silver.

13. A display apparatus comprising:
the organic device according to claim 1; and
an active element connected to the organic device.

14. An image capturing apparatus comprising:
an optical unit that includes a plurality of lenses;
an image capturing element configured to receive light that passed through the optical unit; and
a display unit configured to display an image,
wherein the display unit is a display unit that displays an image captured by the image capturing element and includes the organic device according to claim 1.

15. An illumination apparatus comprising:
a light source; and
at least one of a light diffusing unit and an optical film,
wherein the light source includes the organic device according to claim 1.

16. A moving body comprising:
a body; and
a lighting device arranged on the body,
wherein the lighting device includes the organic device according to claim 1.

17. An organic device comprising a reflective electrode configured to reflect light, an organic layer arranged on the reflective electrode, a semi-transmissive electrode arranged on the organic layer, and an interference adjustment layer arranged on the semi-transmissive electrode,
wherein the organic layer includes a light emitting layer configured to emit blue light,
wherein the interference adjustment layer includes a first layer in contact with the semi-transmissive electrode, a second layer arranged on the first layer, and a third layer arranged on the second layer, wherein the first layer is made of an element selected from the group consisting of silicon nitride, silicon oxynitride, titanium oxide, zinc sulfide, and indium tin oxide,
wherein the second layer is made of an element selected from the group consisting of magnesium fluoride, lithium fluoride, a fluoropolymer, silver, magnesium, and combinations thereof,
wherein the third layer is made of an element selected from the group consisting of silicon oxide, silicon nitride, silicon oxynitride, and aluminum oxide,
wherein a film thickness of the organic layer is not less than 85 nm,
wherein a film thickness of the first layer is not more than 50 nm,
wherein a film thickness of the second layer is 10 nm to 300 nm,
wherein an optical distance L of the organic layer satisfies:

$$L \geq [\{(\phi r + \phi s)/\pi\} \times (\lambda b/4)] \times 1.2,$$

where λb [nm] is a peak wavelength of emitted light of a blue light emitting layer, ϕr [rad] is a phase shift amount of the light of the wavelength λb in the reflective electrode, ϕs [rad] is a phase shift amount of the light of the wavelength λb in the semi-transmissive electrode, and
wherein a resonant wavelength of an optical distance between the semi-transmissive electrode and a reflection surface formed above the semi-transmissive electrode is shorter than the wavelength λb.

18. An organic device comprising a reflective electrode configured to reflect light, an organic layer arranged on the reflective electrode, a semi-transmissive electrode arranged on the organic layer, and an interference adjustment layer arranged on the semi-transmissive electrode,
wherein the organic layer includes a light emitting layer configured to emit blue light,
wherein the interference adjustment layer includes a first layer in contact with the semi-transmissive electrode, a second layer arranged on the first layer, and a third layer arranged on the second layer,
wherein the first layer is made of an element selected from the group consisting of silicon nitride, silicon oxynitride, titanium oxide, zinc sulfide, and indium tin oxide,
wherein the second layer is made of an element selected from the group consisting of magnesium fluoride, lithium fluoride, a fluoropolymer, silver, magnesium, and combinations thereof,
wherein the third layer is made of an element selected from the group consisting of silicon oxide, silicon nitride, silicon oxynitride, and aluminum oxide,
wherein a film thickness of the organic layer is not less than 85 nm,
wherein a film thickness of the first layer is not more than 50 nm,
wherein a film thickness of the second layer is 10 nm to 300 nm, and
wherein an optical distance L1 of the first layer satisfies:

$$L1 \leq (\lambda b/2) \times 0.8,$$

where λb [nm] is a peak wavelength of emitted light of a blue light emitting layer.

* * * * *